(12) United States Patent
Chung et al.

(10) Patent No.: US 12,520,531 B2
(45) Date of Patent: Jan. 6, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chia-Ling Chung, Hsinchu (TW); Chun-Chih Cheng, Changhua (TW); Ying-Liang Chuang, Hsinchu (TW); Ming-Hsi Yeh, Hsinchu (TW); Kuo-Bin Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 477 days.

(21) Appl. No.: 18/153,491

(22) Filed: Jan. 12, 2023

(65) Prior Publication Data
US 2023/0420534 A1 Dec. 28, 2023

Related U.S. Application Data

(63) Continuation-in-part of application No. 17/809,030, filed on Jun. 27, 2022.
(Continued)

(51) Int. Cl.
*H10D 30/67* (2025.01)
*H01L 21/28* (2025.01)
(Continued)

(52) U.S. Cl.
CPC ... *H10D 30/6735* (2025.01); *H01L 21/28079* (2013.01); *H01L 21/2855* (2013.01);
(Continued)

(58) Field of Classification Search
CPC ...... H10D 30/014; H10D 30/43; H10D 30/62; H10D 30/6735; H10D 30/6757;
(Continued)

(56) References Cited

U.S. PATENT DOCUMENTS

| 8,536,660 | B2 * | 9/2013 | Hsu | H10D 84/038 |
| | | | | 257/410 |
| 9,306,023 | B2 * | 4/2016 | Ho | H10D 84/014 |

(Continued)

*Primary Examiner* — Sophia T Nguyen
(74) *Attorney, Agent, or Firm* — Ingrassia Fisher & Lorenz, LLP

(57) ABSTRACT

Disclosed is a semiconductor device and semiconductor fabrication method. A semiconductor device includes: a gate structure over a semiconductor substrate, having a low-k dielectric layer, a high-k dielectric layer, a p-type work function metal layer, an n-type work function metal layer, a silicon oxide scap layer, and a glue layer; and a continuous tungsten (W) cap over the gate structure that was formed by the gate structure being pretreated, W material being deposited and etched back, the scap layer being etched, additional W material being deposited, and unwanted W material being removed. A semiconductor fabrication method includes: receiving a gate structure; pretreating the gate structure; depositing W material on the gate structure; etching back the W material; etching the scap layer; depositing additional W material; and removing unwanted W material.

20 Claims, 25 Drawing Sheets

Related U.S. Application Data

(60) Provisional application No. 63/382,839, filed on Nov. 8, 2022.

(51) Int. Cl.
- H01L 21/285 (2006.01)
- H01L 21/768 (2006.01)
- H01L 23/522 (2006.01)
- H10D 64/01 (2025.01)
- H10D 64/66 (2025.01)
- H10D 84/01 (2025.01)
- H10D 84/03 (2025.01)

(52) U.S. Cl.
CPC .. H01L 21/76814 (2013.01); H01L 21/76834 (2013.01); H01L 21/76877 (2013.01); H01L 23/5226 (2013.01); H10D 64/017 (2025.01); H10D 64/666 (2025.01); H10D 84/0137 (2025.01); H10D 84/038 (2025.01)

(58) Field of Classification Search
CPC .. H10D 30/024; H10D 30/435; H10D 30/501; H10D 30/502; H10D 30/507; H10D 30/60; H10D 64/517; H10D 64/518; H10D 64/017; H10D 64/251; H10D 64/259; H10D 64/258; H10D 64/605; H10D 64/665; H10D 64/666; H10D 64/669; H10D 64/118; H10D 84/0137; H10D 84/0135; H10D 84/0149; H10D 84/0172; H10D 84/0177; H10D 84/014; H01L 21/76895; H01L 21/76877; H01L 21/28079; H01L 21/28088; H01L 21/02362; H01L 23/5226

See application file for complete search history.

(56) References Cited

U.S. PATENT DOCUMENTS

| | | | | |
|---|---|---|---|---|
| 9,583,362 | B2* | 2/2017 | Ho | H01L 21/32136 |
| 9,876,114 | B2* | 1/2018 | JangJian | H10D 84/038 |
| 10,032,890 | B2* | 7/2018 | Yim | H10D 30/024 |
| 10,770,563 | B2 | 9/2020 | Cheng et al. | |
| 11,282,938 | B2* | 3/2022 | Tang | H01L 21/28088 |
| 11,757,023 | B2* | 9/2023 | Shen | H01L 21/02186 |
| | | | | 257/288 |
| 12,131,955 | B2 | 10/2024 | Cheng | H10D 64/01 |
| 2002/0062841 | A1 | 5/2002 | Twu et al. | |
| 2005/0250339 | A1 | 11/2005 | Shea et al. | |
| 2006/0145292 | A1 | 7/2006 | Park | |
| 2007/0190797 | A1* | 8/2007 | Wu | H01L 21/02074 |
| | | | | 438/692 |
| 2010/0187610 | A1* | 7/2010 | Kwon | H10D 84/0167 |
| | | | | 438/587 |
| 2011/0108928 | A1* | 5/2011 | Tao | H10D 30/794 |
| | | | | 257/410 |
| 2013/0009310 | A1 | 1/2013 | Sapra et al. | |
| 2014/0001543 | A1* | 1/2014 | Kim | H10D 64/665 |
| | | | | 257/329 |
| 2014/0306273 | A1* | 10/2014 | Ho | H10D 30/0227 |
| | | | | 257/288 |
| 2015/0061041 | A1* | 3/2015 | Lin | H10D 84/0177 |
| | | | | 438/761 |
| 2015/0061042 | A1* | 3/2015 | Cheng | H01L 21/28088 |
| | | | | 257/412 |
| 2015/0102348 | A1* | 4/2015 | Cai | H10D 84/038 |
| | | | | 257/69 |
| 2015/0145057 | A1* | 5/2015 | Fan | H01L 21/28088 |
| | | | | 257/369 |
| 2016/0163809 | A1* | 6/2016 | Ok | H10D 64/667 |
| | | | | 257/369 |
| 2016/0181163 | A1* | 6/2016 | Huang | H10D 84/85 |
| | | | | 257/369 |
| 2016/0372565 | A1* | 12/2016 | Huang | H10D 84/038 |
| 2017/0092885 | A1 | 3/2017 | Sakuishi et al. | |
| 2017/0125535 | A1 | 5/2017 | Niimi et al. | |
| 2017/0186743 | A1* | 6/2017 | Chiou | H10D 84/0135 |
| 2018/0012806 | A1 | 1/2018 | Li et al. | |
| 2018/0083002 | A1 | 3/2018 | Kim et al. | |
| 2018/0277653 | A1* | 9/2018 | Deng | H10D 64/691 |
| 2018/0294191 | A1 | 10/2018 | Bao et al. | |
| 2018/0331045 | A1 | 11/2018 | Ameele et al. | |
| 2019/0088542 | A1* | 3/2019 | Hsieh | H10D 30/6219 |
| 2019/0164829 | A1* | 5/2019 | Yang | H10D 30/024 |
| 2019/0355620 | A1 | 11/2019 | Freed et al. | |
| 2019/0371675 | A1* | 12/2019 | Tsai | H10D 84/0158 |
| 2020/0043787 | A1 | 2/2020 | Su et al. | |
| 2020/0044072 | A1* | 2/2020 | Chiang | H10D 30/62 |
| 2020/0044073 | A1 | 2/2020 | Huang et al. | |
| 2020/0058785 | A1 | 2/2020 | Tsai et al. | |
| 2020/0075409 | A1 | 3/2020 | Wang et al. | |
| 2020/0098922 | A1 | 3/2020 | You et al. | |
| 2020/0105895 | A1* | 4/2020 | Tang | H01L 21/321 |
| 2020/0105931 | A1* | 4/2020 | Wu | H10D 62/822 |
| 2020/0126843 | A1 | 4/2020 | Tsai et al. | |
| 2020/0126979 | A1 | 4/2020 | Ching et al. | |
| 2020/0135879 | A1 | 4/2020 | Cheng et al. | |
| 2020/0135912 | A1* | 4/2020 | Tsai | H10D 84/038 |
| 2020/0161439 | A1* | 5/2020 | You | H10D 30/024 |
| 2020/0219931 | A1 | 7/2020 | Amanapu et al. | |
| 2020/0279773 | A1 | 9/2020 | Shusterman et al. | |
| 2020/0312994 | A1* | 10/2020 | You | H10D 30/6211 |
| 2020/0365698 | A1* | 11/2020 | Tsai | H10D 64/01 |
| 2020/0403078 | A1 | 12/2020 | Cheng et al. | |
| 2021/0035989 | A1* | 2/2021 | Lee | H10D 30/43 |
| 2021/0043499 | A1 | 2/2021 | Tsai et al. | |
| 2021/0043747 | A1 | 2/2021 | Cheng et al. | |
| 2021/0057579 | A1 | 2/2021 | Yu et al. | |
| 2021/0082756 | A1* | 3/2021 | Tsai | H01L 21/76847 |
| 2021/0083046 | A1 | 3/2021 | Lin et al. | |
| 2021/0202734 | A1 | 7/2021 | Tsai et al. | |
| 2021/0265218 | A1 | 8/2021 | Chuang et al. | |
| 2021/0305427 | A1 | 9/2021 | Bae et al. | |
| 2021/0399109 | A1 | 12/2021 | Su et al. | |
| 2022/0037499 | A1 | 2/2022 | Chu et al. | |
| 2022/0102199 | A1 | 3/2022 | Hsiung et al. | |
| 2022/0102204 | A1 | 3/2022 | Hsiung et al. | |
| 2022/0102211 | A1 | 3/2022 | Hsiung et al. | |
| 2022/0102219 | A1 | 3/2022 | Hsiung et al. | |
| 2022/0102507 | A1 | 3/2022 | Hsiung et al. | |
| 2022/0102508 | A1 | 3/2022 | Lee | |
| 2022/0102511 | A1* | 3/2022 | Hsiung | H01L 23/5226 |
| 2022/0123124 | A1 | 4/2022 | Chiu et al. | |
| 2022/0209031 | A1 | 6/2022 | Breus et al. | |
| 2022/0278108 | A1 | 9/2022 | Yang et al. | |
| 2022/0285220 | A1* | 9/2022 | Lim | H10D 84/038 |
| 2022/0406913 | A1 | 12/2022 | Chen et al. | |
| 2023/0178361 | A1 | 6/2023 | Hung et al. | |
| 2024/0117277 | A1 | 4/2024 | Oie et al. | |
| 2024/0170278 | A1 | 5/2024 | Oie et al. | |

* cited by examiner

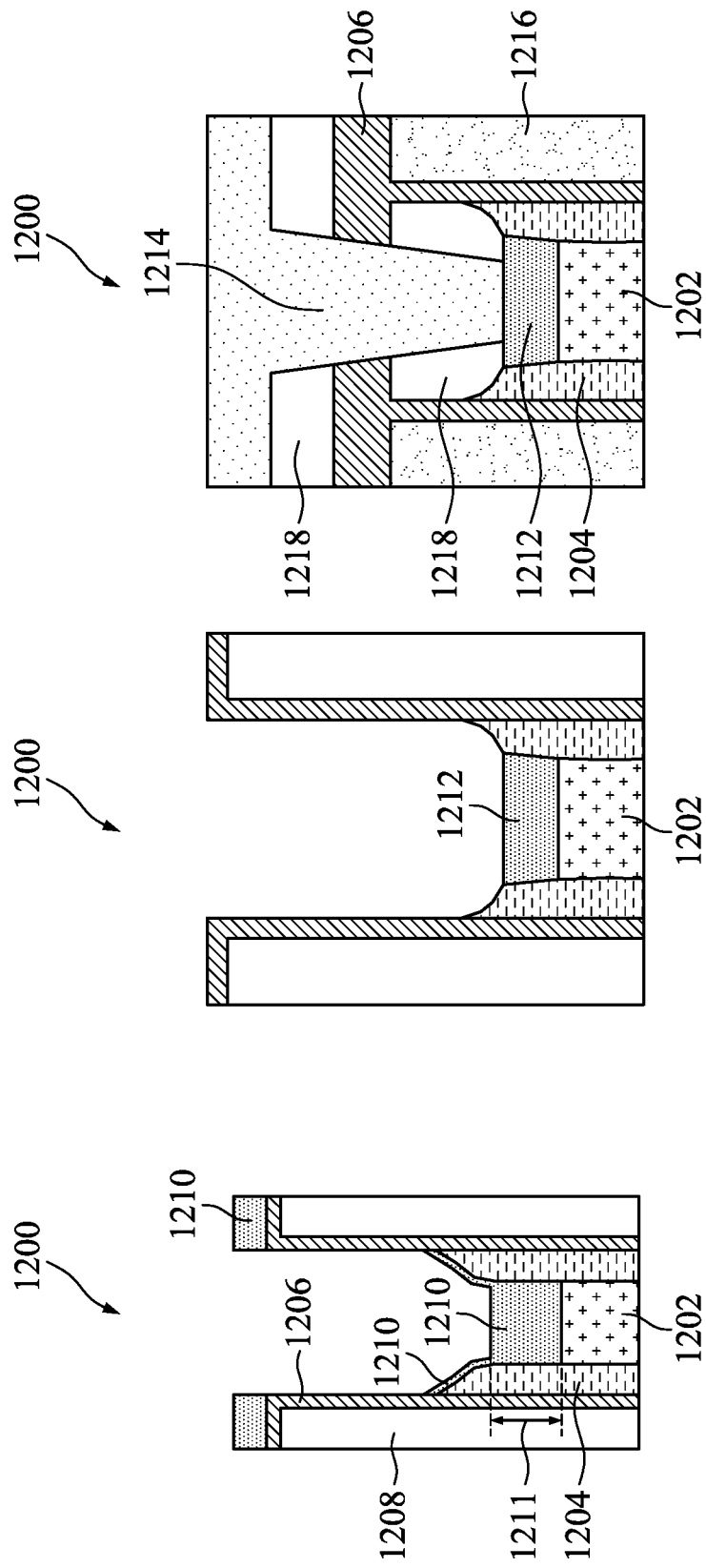

SEMICONDUCTOR DEVICE AND MANUFACTURING METHOD THEREOF

CROSS REFERENCE TO RELATED APPLICATIONS

This claims priority as a continuation in part of U.S. application Ser. No. 17/809,030, filed Jun. 27, 2022, which is incorporated herein by reference. This claims priority to U.S. Provisional Application No. 63/382,839, filed Nov. 8, 2022, which is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12A-12F are diagrams depicting enlarged views of an example semiconductor device at various stages of fabricating a Tungsten (W) cap above a metal gate, in accordance with some embodiments.

DETAILED DESCRIPTION

Figure 1:
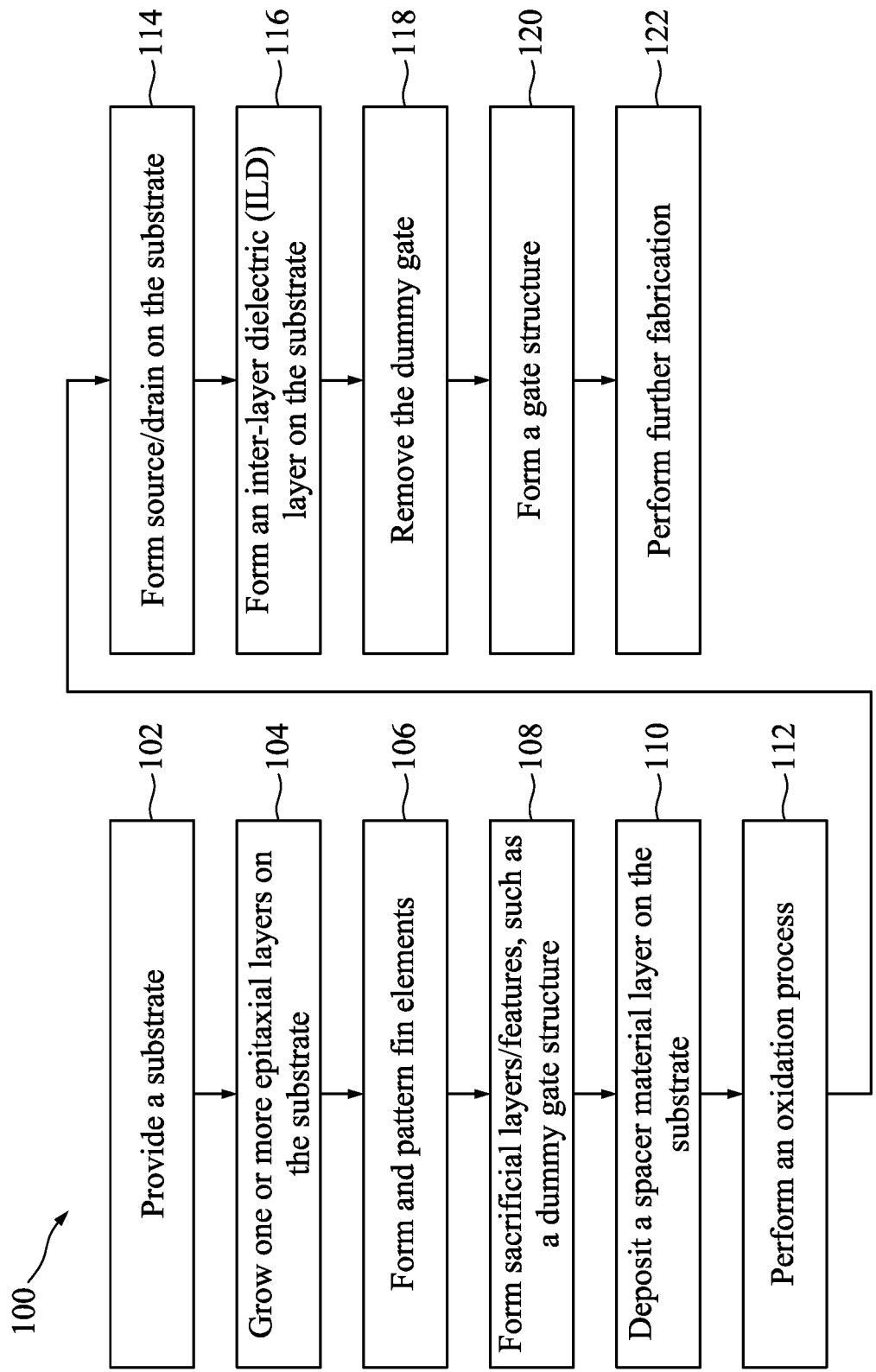
FIG. 1 is a flow chart depicting an example method of semiconductor fabrication including fabrication of multi-gate devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) FinFET device and an N-type metal-oxide-semiconductor (NMOS) FinFET device. Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

FIG. 1 is a flow chart depicting an example method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped) and various dimensions.

FIG. 1 is described in conjunction with FIGS. 2A-2B, 3A-3B, 4A-4B, 5A-5B, 6A-6B, 7A-7B, 8A-8B, 9A-9B and 10A-10B, which illustrate a semiconductor device or structure at various stages of fabrication in accordance with some embodiments. The method 100 is merely an example and is not intended to limit the present disclosure beyond what is explicitly recited in the claims. Additional steps may be provided before, during, and after method 100, and some of the steps described can be moved, replaced, or eliminated for additional embodiments of method 100. Additional features may be added in the semiconductor device depicted in the figures, and some of the features described below can be replaced, modified, or eliminated in other embodiments.

As with the other method embodiments and exemplary devices discussed herein, it is understood that parts of the semiconductor devices may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, dials, fuses, and or other logic devices, etc., but is simplified for better understanding of concepts of the present disclosure. In some embodiments, exemplary devices include a plurality of semiconductor devices (e.g., transistors), including PFETs, NFETs, etc., which may be interconnected. Moreover, it is noted that the process steps of method 100, include any descriptions given with reference to the figures, as with the remainder of the method and exemplary figures provided in this disclosure, are merely exemplary and are not intended to be limiting beyond what is specifically recited in the claims that follow.

FIGS. 2A, 3A, 4A, 5A, 6A, 7A, 8A, 9A and 10A, are isometric views of an example semiconductor device 200 and FIGS. 2B, 3B, 4B, 5B, 6B, 7B, 8B, 9B and 10B are corresponding cross-sectional side views of an embodiment of the example semiconductor device 200 along a first cut X-X' in an example process fabrication process in accordance with some embodiments. In some figures, some reference numbers of components or features illustrated therein may be omitted to avoid obscuring other components or features; this is for ease of depicting the figures.

At block 102, the example method 100 includes providing a substrate. Referring to the example of FIGS. 2A and 2B, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

Returning to FIG. 1, the method 100 then proceeds to block 104 where one or more epitaxial layers are grown on the substrate. With reference to the example of FIGS. 2A and 2B, in an embodiment of block 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layer 206 includes SiGe and where the epitaxial layer 208 includes Si, the Si oxidation rate of the epitaxial layer 208 is less than the SiGe oxidation rate of the epitaxial layer 206.

The epitaxial layers 208 or portions thereof may form a channel region of the multi-gate device 200. For example, the epitaxial layers 208 may be referred to as "nanowires" used to form a channel region of a multi-gate device 200 such as a GAA device. These "nanowires" are also used to form portions of the source/drain regions of the multi-gate device 200 as discussed below. Source/drain region(s) may refer to a source or a drain, individually or collectively dependent upon the context. Again, as the term is used herein, "nanowires" refers to semiconductor layers that are cylindrical in shape as well as other configurations such as, bar-shaped. The use of the epitaxial layers 208 to define a channel or channels of a device is further discussed below.

Figure 2B:
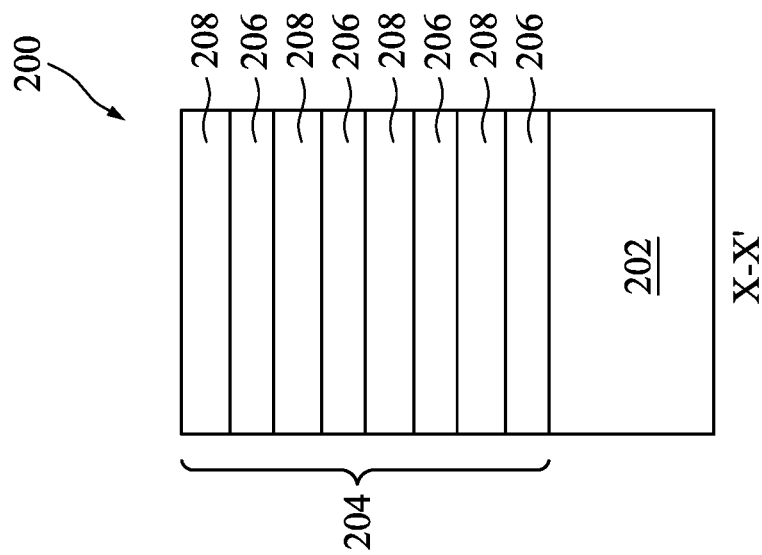
FIGS. 2B, 3B, 4B, 5B, 6B, 7B, 8B, 9B and 10B are corresponding cross-sectional side views of an embodiment of the example semiconductor device along a first cut X-X', in accordance with some embodiments.
Figure 2A:
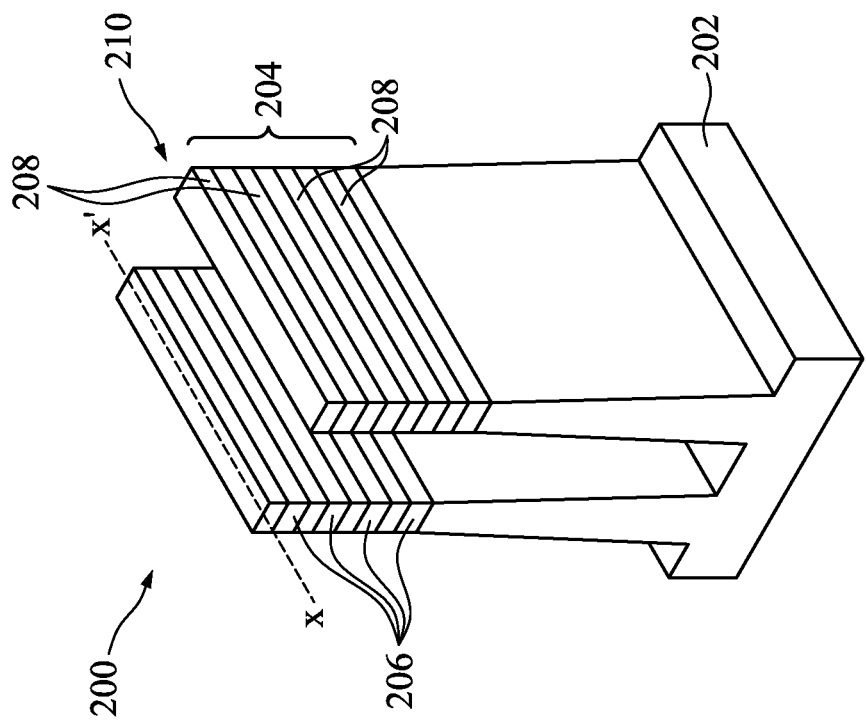
FIGS. 2A, 3A, 4A, 5A, 6A, 7A, 8A, 9A and 10A, are isometric views of an example semiconductor device, in accordance with some embodiments.

It is noted that four (4) layers of each of epitaxial layers 206 and 208 are illustrated in FIGS. 2A and 2B, this is for illustrative purposes only and not intended to be limiting beyond what is specifically recited in the claims. It can be appreciated that any number of epitaxial layers can be formed in the epitaxial stack 204; the number of layers depending on the desired number of channels regions for the device 200. In some embodiments, the number of epitaxial layers 208 is between 2 and 10.

In some embodiments, the epitaxial layer 206 has a thickness range of about 2-6 nanometers (nm). The epitaxial layers 206 may be substantially uniform in thickness. In some embodiments, the epitaxial layer 208 has a thickness range of about 6-12 nm. In some embodiments, the epitaxial layers 208 of the stack are substantially uniform in thickness. As described in more detail below, the epitaxial layer 208 may serve as channel region(s) for a subsequently-formed multi-gate device and its thickness chosen based on device performance considerations. The epitaxial layer 206 may serve to define a gap distance between adjacent channel region(s) for a subsequently-formed multi-gate device and its thickness chosen based on device performance considerations.

By way of example, epitaxial growth of the layers of the stack 204 may be performed by a molecular beam epitaxy (MBE) process, a metalorganic chemical vapor deposition (MOCVD) process, and/or other suitable epitaxial growth processes. In some embodiments, the epitaxially grown layers 206, 208 include the same material as the substrate 202. In some embodiments, the epitaxially grown layers 206, 208 include a different material than the substrate 202. As stated above, in at least some examples, the epitaxial layer 206 includes an epitaxially grown silicon germanium (SiGe) layer and the epitaxial layer 208 includes an epitaxially grown silicon (Si) layer. Alternatively, in some embodiments, either of the epitaxial layers 206, 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206, 208 may be chosen based on providing differing oxidation, etch selectivity properties. In various embodiments, the epitaxial layers 206, 208 are substantially dopant-free (i.e., having an extrinsic dopant concentration from about 0 $cm^{-3}$ to about $1 \times 1017$ $cm^{-3}$), where for example, no intentional doping is performed during the epitaxial growth process.

The method 100 then proceeds to block 106 where fin elements are patterned and formed. With reference to the example of FIG. 2A, in an embodiment of block 106, a plurality of fin elements 210 extending from the substrate 202 are formed. In various embodiments, each of the fin elements 210 includes a substrate portion formed from the substrate 202, portions of each of the epitaxial layers of the epitaxial stack including epitaxial layers 206 and 208.

The fin elements 210 may be fabricated using suitable processes including photolithography and etch processes. The photolithography process may include forming a photoresist layer over the substrate 202 (e.g., over the epi stack 204), exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate 202, and layers 204 formed thereupon, while an etch process forms trenches in unprotected regions through masking layer(s) such as hard mask, thereby leaving the plurality of extending fins. The trenches may be etched using a dry etch (e.g., reactive ion etching), a wet etch, and/or other suitable processes. The trenches may be filled with dielectric material forming, for example, shallow trench isolation features interposing the fins.

In some embodiments, the dielectric layer may include SiO2, silicon nitride, silicon oxynitride, fluorine-doped silicate glass (FSG), a low-k dielectric, combinations thereof, and/or other suitable materials known in the art. In various examples, the dielectric layer may be deposited by a chemical vapor deposition (CVD) process, a sub atmospheric CVD (SACVD) process, a flowable CVD process, an atomic layer deposition (ALD) process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 302) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. The CMP process may planarize the top surface thereby forming STI features 302. The STI features 302 interposing the fin elements are recessed. Referring to the example of FIG. 3A, the STI features 302 are recessed providing the fins 210 extending above the STI features 302. In some embodiments, the recessing process may include a dry etching process, a wet etching process, and/or a combination thereof. In some embodiments, a recessing depth is controlled (e.g., by controlling an etching time) so as to result in a desired height 'H' of the exposed upper portion of the fin elements 210. The height 'H' exposes each of the layers of the epitaxy stack 204.

Numerous other embodiments of methods to form the fins on the substrate may also be used including, for example, defining the fin region (e.g., by mask or isolation regions) and epitaxially growing the epitaxial stack 204 in the form of the fin. In some embodiments, forming the fins may include a trim process to decrease the width of the fins. The trim process may include wet or dry etching processes.

The method 100 then proceeds to block 108 where sacrificial layers/features are formed and in particular, a dummy gate structure. While the present discussion is directed to a replacement gate process whereby a dummy gate structure is formed and subsequently replaced, other configurations may be possible.

Figure 3B:
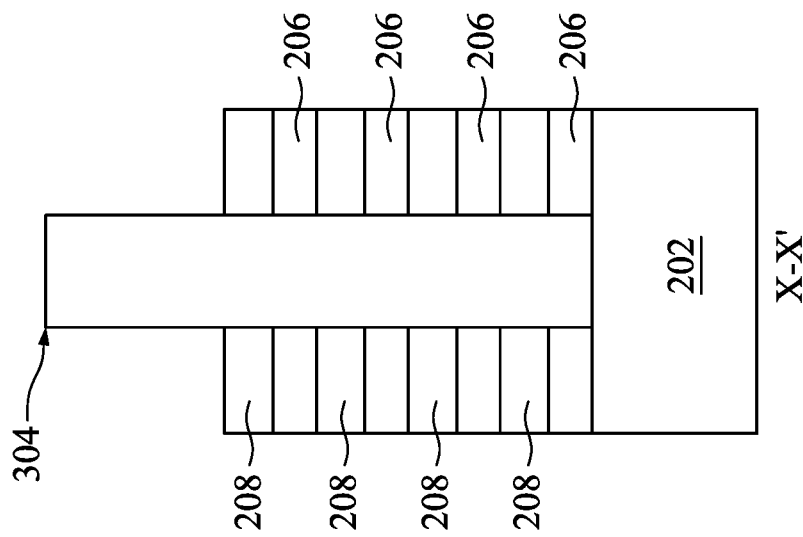
Figure 3A:
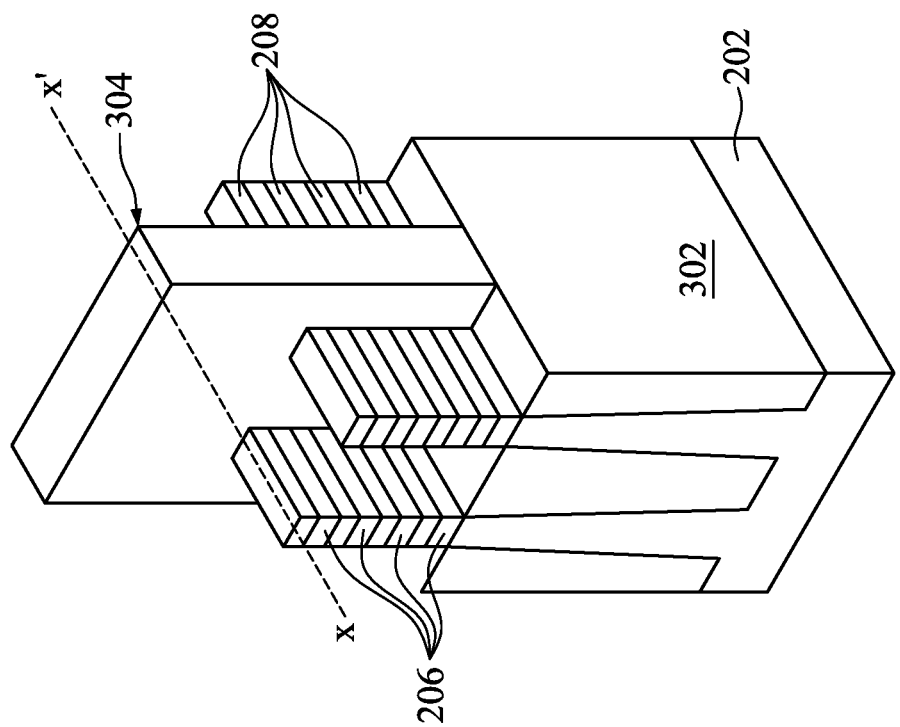

With reference to FIGS. 3A and 3B, a gate stack 304 is formed. In an embodiment, the gate stack 304 is a dummy (sacrificial) gate stack that is subsequently removed as discussed with reference to block 108 of the method 100.

Thus, in some embodiments using a gate-last process, the gate stack 304 is a dummy gate stack and will be replaced by the final gate stack at a subsequent processing stage of the device 200. In particular, the gate stack 304 may be replaced at a later processing stage by a high-K dielectric layer (HK) and metal gate electrode (MG) as discussed below. In some embodiments, the gate stack 304 is formed over the substrate 202 and is at least partially disposed over the fin elements 210. The portion of the fin elements 210 underlying the gate stack 304 may be referred to as the channel region. The gate stack 304 may also define a source/drain region of the fin elements 210, for example, the regions of the fin and epitaxial stack 204 adjacent and on opposing sides of the channel region.

In some embodiments, the gate stack 304 includes the dielectric layer and a dummy electrode layer. The gate stack 304 may also include one or more hard mask layers (e.g., oxide, nitride). In some embodiments, the gate stack 304 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the gate stack 304 may include an additional gate dielectric layer. For example, the gate stack 304 may include silicon oxide. Alternatively or additionally, the gate dielectric layer of the gate stack 304 may include silicon nitride, a high-K dielectric material or other suitable material. In some embodiments, an electrode layer of the gate stack 304 may include polycrystalline silicon (polysilicon). Hard mask layers such as SiO2, Si3N4, silicon oxynitride, alternatively include silicon carbide, and/or other suitable compositions may also be included.

Figure 4B:
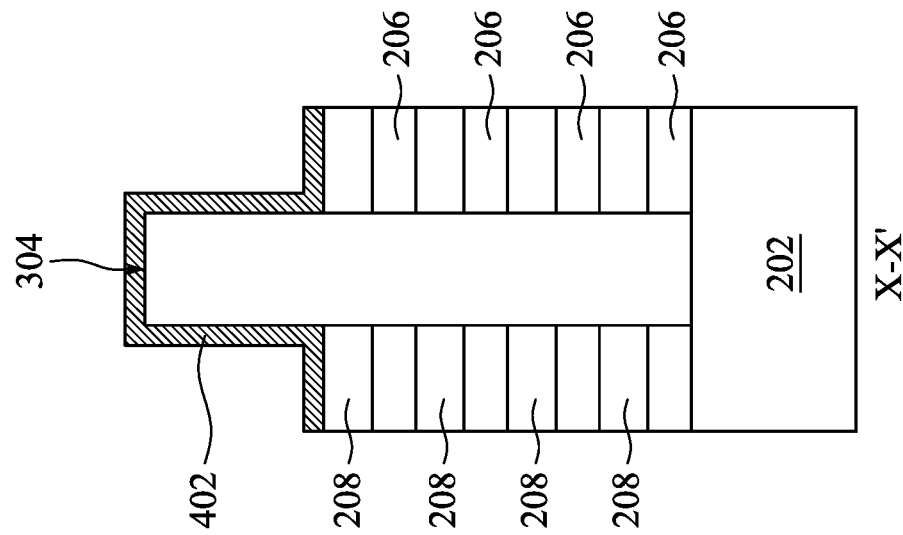
Figure 4A:
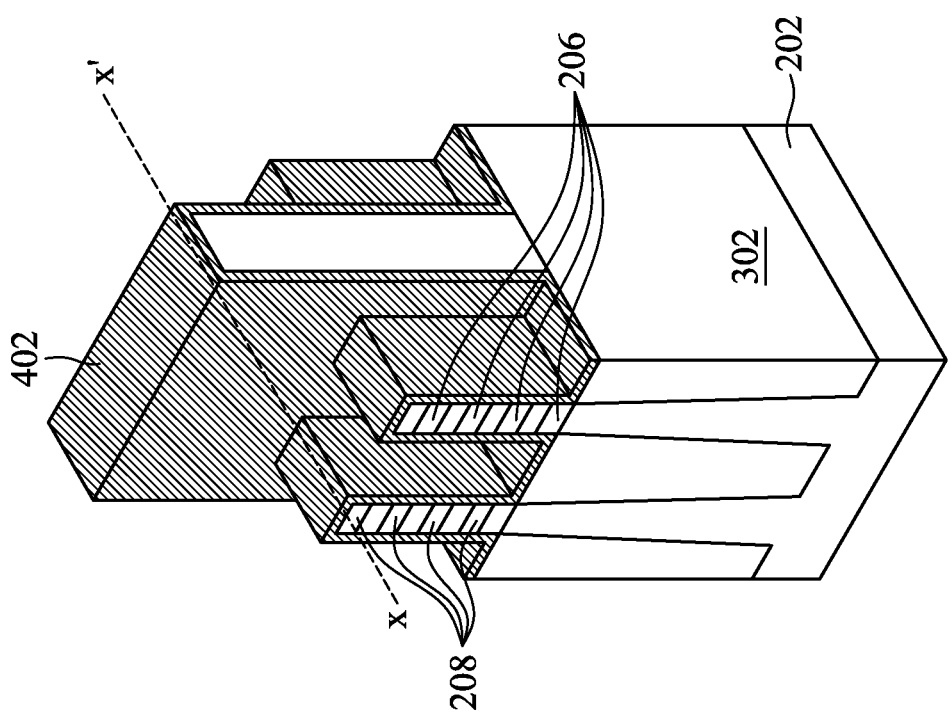

The method 100 then proceeds to block 110 where a spacer material layer is deposited on the substrate. Referring to the example of FIGS. 4A and 4B, a spacer material layer 402 is disposed on the substrate 202. The spacer layer 402 may include a dielectric material such as silicon oxide, silicon nitride, silicon carbide, silicon oxynitride, SiCN films, silicon oxycarbide, SiOCN films, and/or combinations thereof. In some embodiments, the spacer material layer 402 includes multiple layers, such as main spacer walls, liner layers, and the like. By way of example, the spacer material layer 402 may be formed by depositing a dielectric material over the gate stack 304 using processes such as, CVD process, a sub atmospheric CVD (SACVD) process, a flowable CVD process, an ALD process, a PVD process, or other suitable process. It is noted that the spacer conformal layer 402 is illustrated in FIG. 4B as covering the epitaxial stack 204.

Figure 5B:
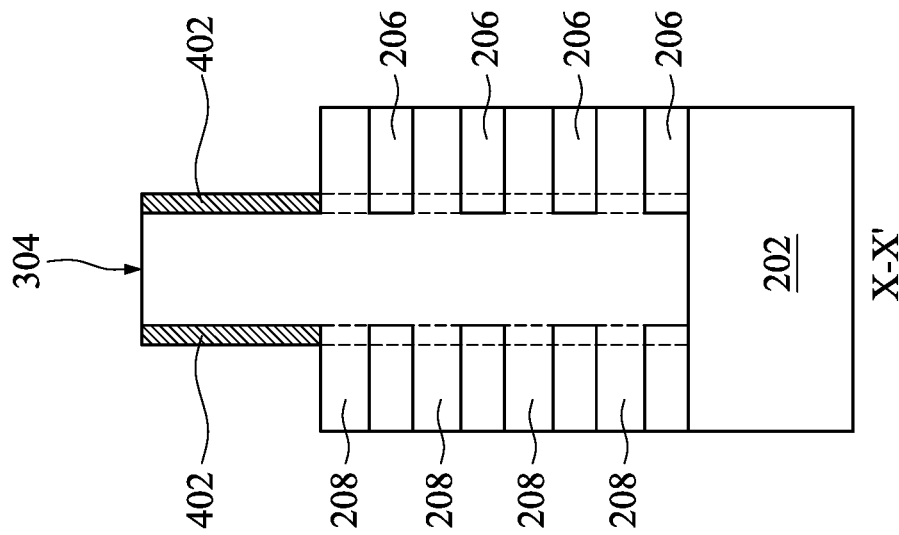
Figure 5A:
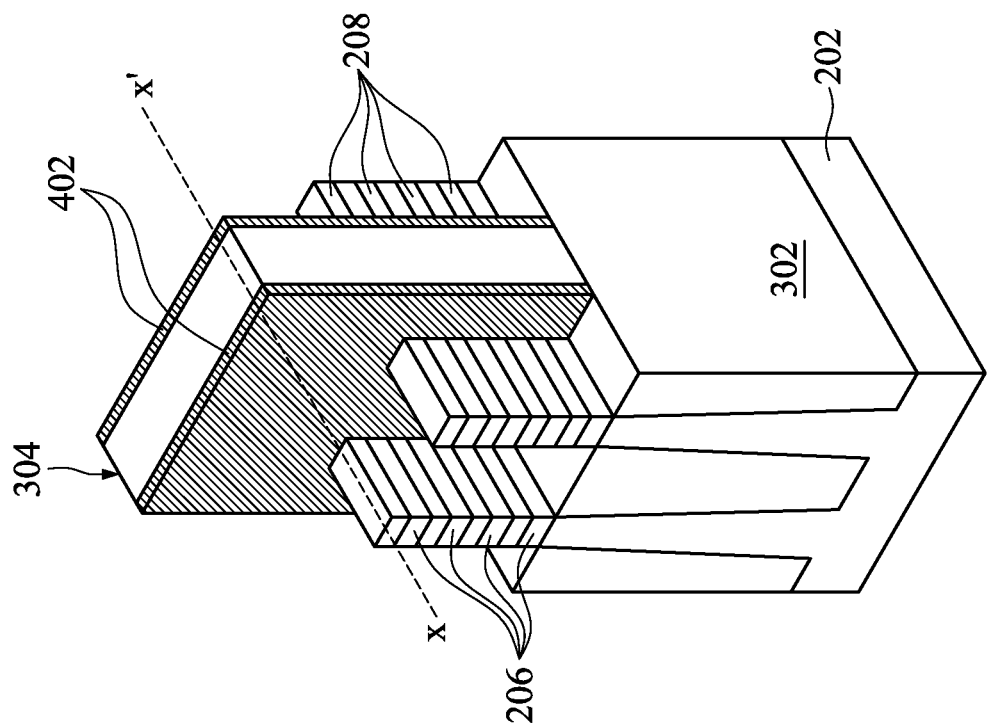

In some embodiments, the deposition of the spacer material layer is followed by an etching back (e.g., anisotropically) the dielectric spacer material. Referring to the example, with reference to the example of FIGS. 5A, 5B, after formation of the spacer material layer 402, the spacer material layer 402 may be etched-back to expose portions of the fin elements 210 adjacent to and not covered by the gate structure 304 (e.g., source/drain regions). The spacer layer material may remain on the sidewalls of the gate structure 304 forming spacer elements. In some embodiments, etching-back of the spacer layer 402 may include a wet etch process, a dry etch process, a multiple-step etch process, and/or a combination thereof. The spacer layer 402 may be removed from a top surface of the exposed epitaxial stack 204 and the lateral surfaces of the exposed epitaxial stack 204, as illustrated in FIGS. 5A and 5B.

The method 100 then proceeds to block 112 where an oxidation process is performed. The oxidation process may be referred to as a selective oxidation as due to the varying oxidation rates of the layers of the epitaxial stack 204, certain layers are oxidized. In some examples, the oxidation process may be performed by exposing the device 200 to a wet oxidation process, a dry oxidation process, or a combination thereof. In at least some embodiments, the device 200 is exposed to a wet oxidation process using water vapor or steam as the oxidant, at a pressure of about 1 ATM, within a temperature range of about 400-600° C., and for a time from about 0.5-2 hours. It is noted that the oxidation process conditions provided herein are merely exemplary, and are not meant to be limiting. It is noted that this oxidation process may, in some embodiments, extend such that the oxidized portion of the epitaxial layer(s) of the stack abuts the sidewall of the gate structure 304.

Figure 6B:
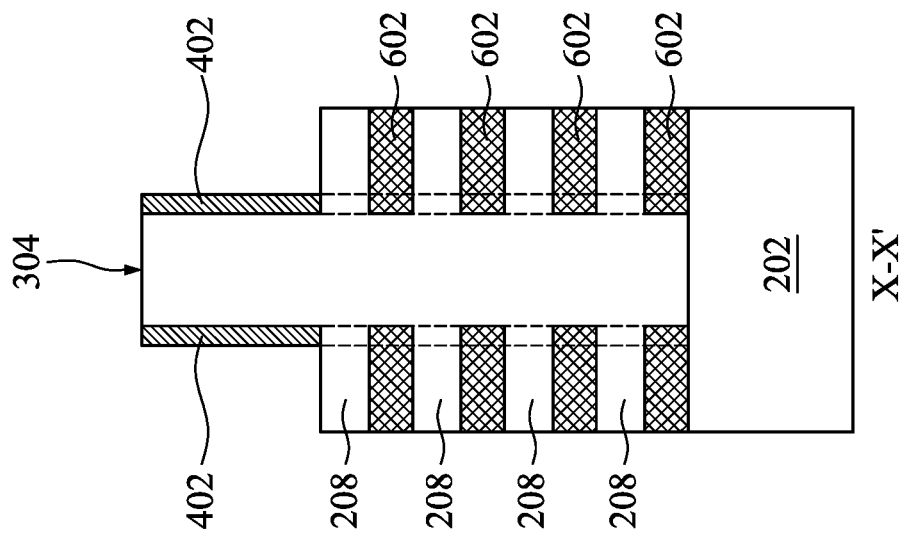
Figure 6A:
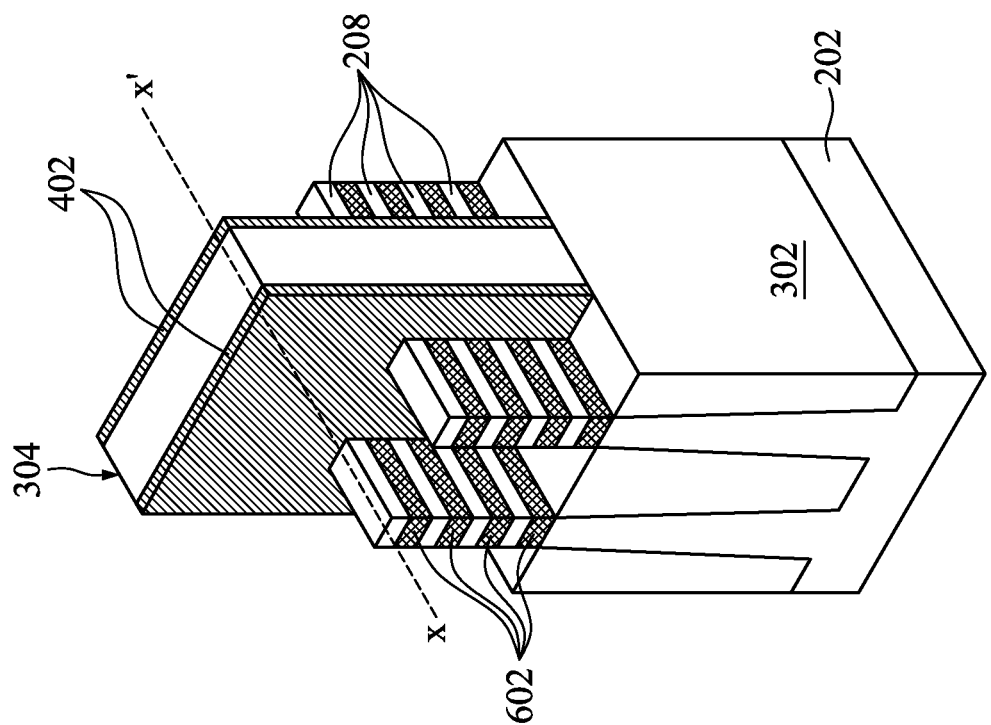
Figure 7B:
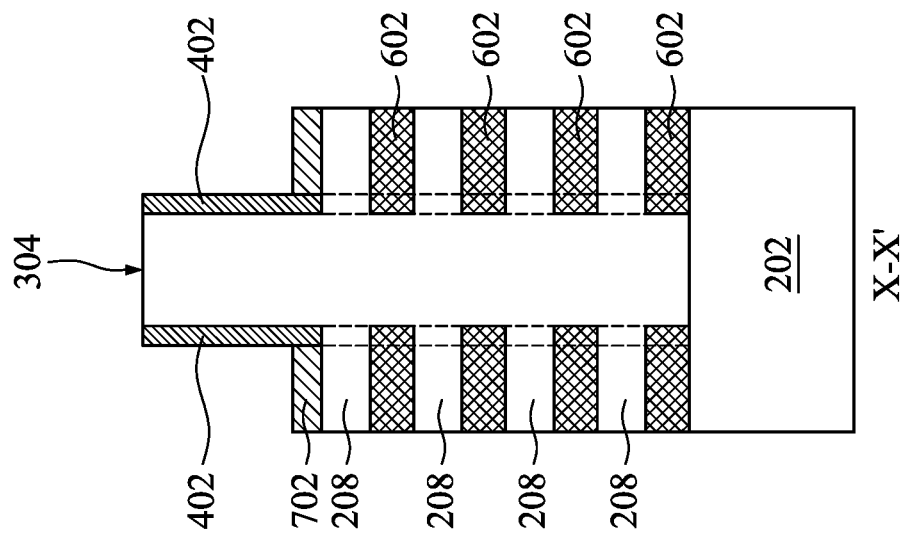
Figure 7A:
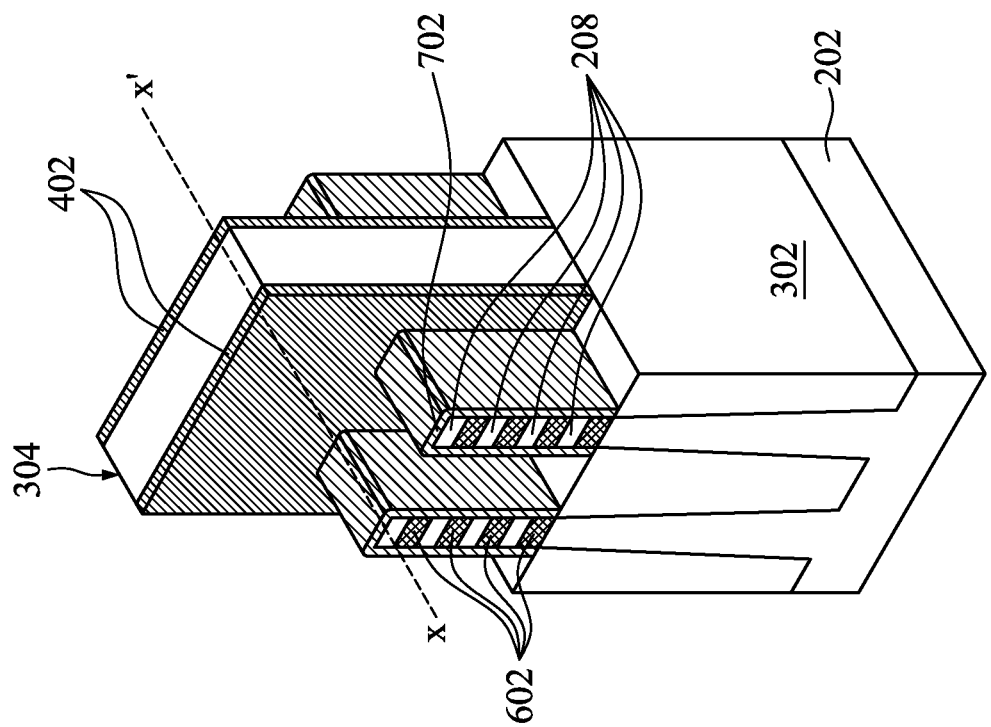
Figure 8B:
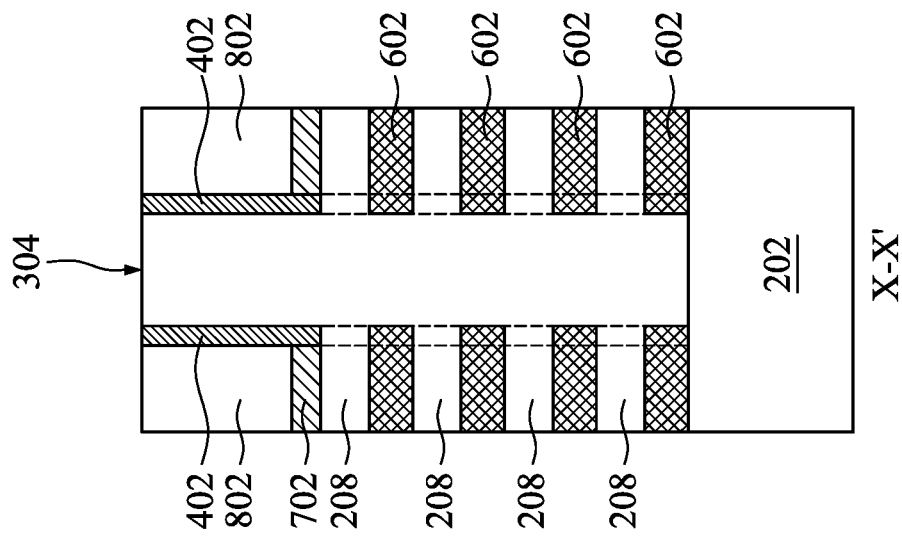
Figure 8A:
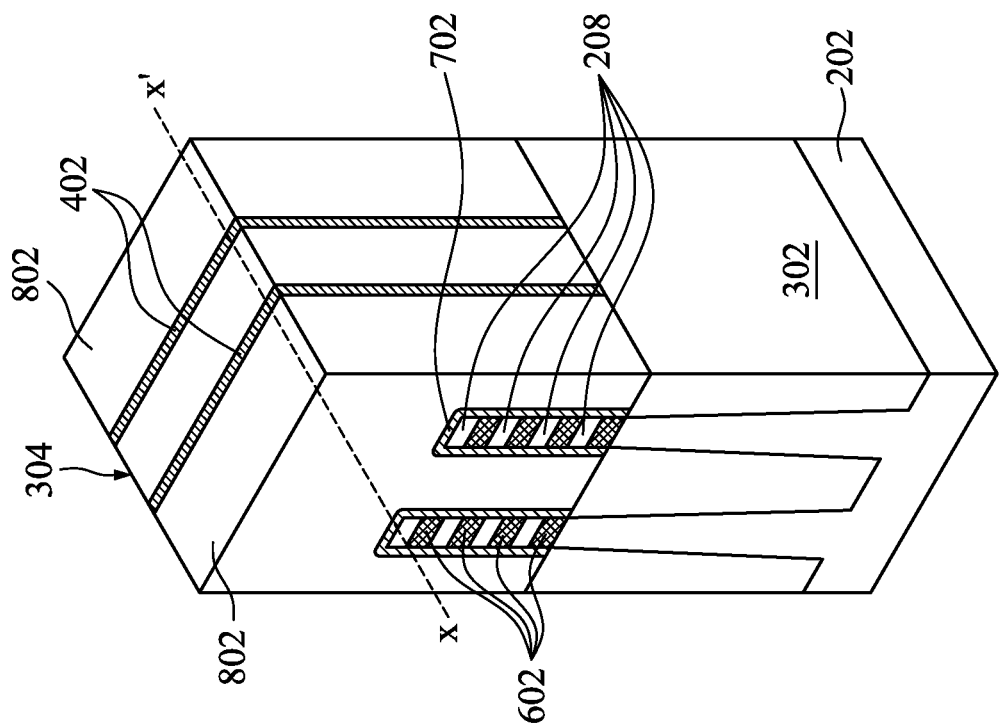
Figure 9B:
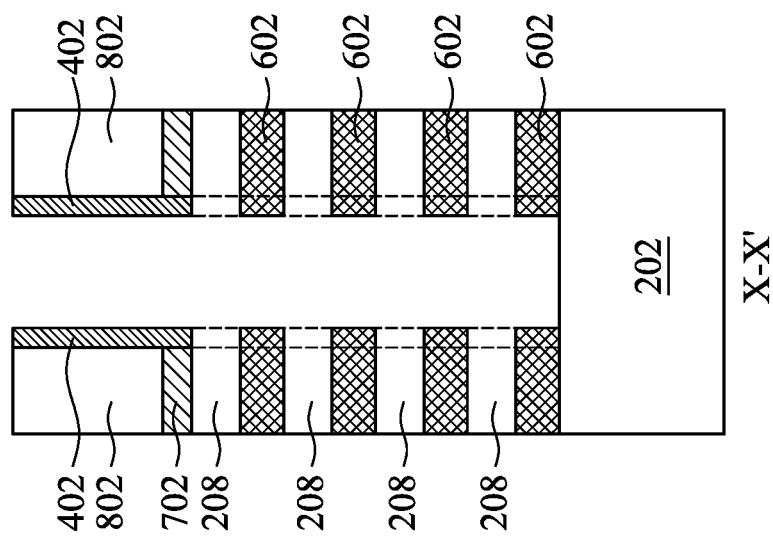
Figure 9A:
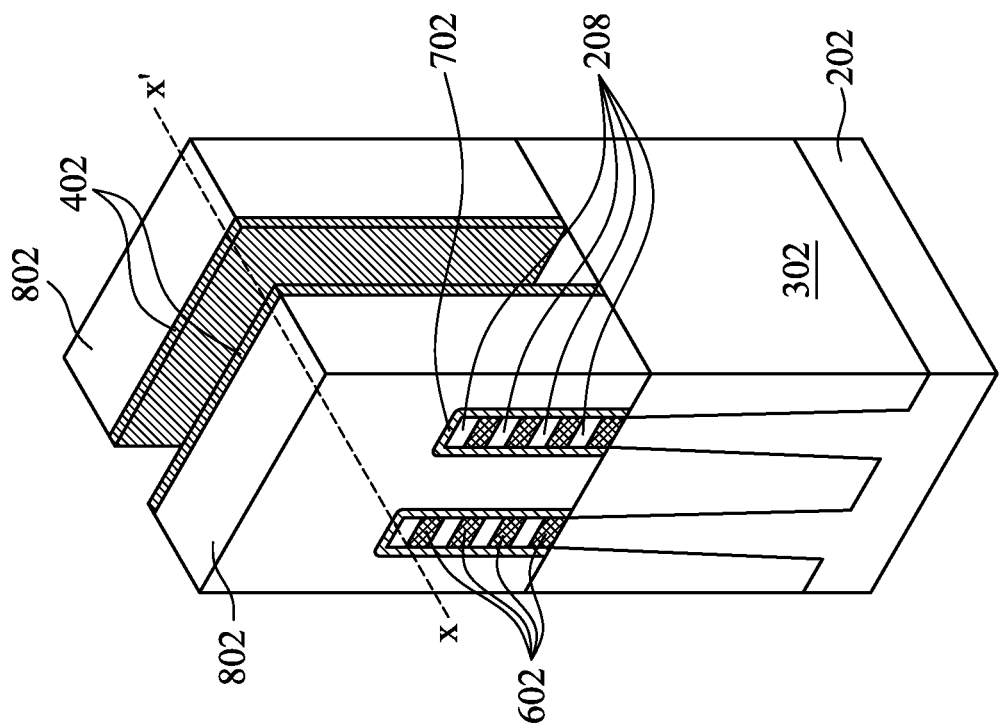

With reference to the example of FIGS. 6A and 6B, in an embodiment of block 112, the device 200 is exposed to an oxidation process that fully oxidizes the epitaxial layer 206 of each of the plurality of fin elements 210. The epitaxial layer 206 transforms into an oxidized layer 602. The oxidized layer 602 extends to the gate structure 304, including, under the spacer elements 402. In some embodiments, the oxidized layer 602 has a thickness range of about 5 to about 25 nanometers (nm). In an embodiment, the oxidized layer 602 may include an oxide of silicon germanium (SiGeOx).

By way of example, in embodiments where the epitaxial layers 206 include SiGe, and where the epitaxial layers portion 208 includes Si, the faster SiGe oxidation rate (i.e., as compared to Si) ensures that the SiGe layer 206 becomes fully oxidized while minimizing or eliminating the oxidation of other epitaxial layers 208. It will be understood that any of the plurality of materials discussed above may be selected for each of the first and second epitaxial layer portions that provide different suitable oxidation rates.

The method 100 then proceeds to block 114 where source/drain features are formed on the substrate. The source/drain features may be formed by performing an epitaxial growth process that provides an epitaxy material on the fin 210 in the source/drain region. In an embodiment, the epitaxy material of the source/drain is formed cladding the portions of the epitaxy layers remaining in the fins' source/drain regions. Referring to the example of FIGS. 7A and 7B, source/drain features 702 are formed on the substrate 202 in/on the fin 210 adjacent to and associated with the gate stack 304. The source/drain features 702 include material formed by epitaxially growing a semiconductor material on the exposed epitaxial layer 208 and/or oxidized layer 602. It is noted that the shape of the features 702 is illustrative only and not intended to be limiting; as understood by one of ordinary skill in the art, any epitaxial growth will occur on the semiconductor material (e.g., 208) as opposed to the dielectric material (e.g., 602), the epitaxial growth may be grown such that it merges over a dielectric layer (e.g., over 602) as illustrated.

In various embodiments, the grown semiconductor material of the source/drain 702 may include Ge, Si, GaAs, AlGaAs, SiGe, GaAsP, SiP, or other suitable material. In some embodiments, the material of the source/drain 702 may be in-situ doped during the epi process. For example, in some embodiments, epitaxially grown material may be doped with boron. In some embodiments, epitaxially grown material may be doped with carbon to form Si:C source/drain features, phosphorous to form Si:P source/drain features, or both carbon and phosphorous to form SiCP source/drain features. In an embodiment, the epitaxial material of the source/drain 702 is silicon and the layer 208 also is silicon. In some embodiments, the layers 702 and 208 may comprise a similar material (e.g., Si), but be differently doped. In other embodiments, the epitaxy layer for the source/drain 702 includes a first semiconductor material, the epitaxially grown material 208 includes a second semiconductor different than the first semiconductor material. In some embodiments, the epitaxially grown material of the source/drain 702 is not in-situ doped, and, for example, instead an implantation process is performed.

The method 100 then proceeds to block 116 where an inter-layer dielectric (ILD) layer is formed on the substrate. Referring to the example of FIGS. 8A and 8B, in an embodiment of block 116, an ILD layer 802 is formed over the substrate 202. In some embodiments, a contact etch stop layer (CESL) is also formed over the substrate 202 prior to forming the ILD layer 802. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 802 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 802 may be deposited by a PECVD process or other suitable deposition technique. In some embodiments, after formation of the ILD layer 802, the semiconductor device 200 may be subject to a high thermal budget process to anneal the ILD layer.

In some examples, after depositing the ILD (and/or CESL or other dielectric layers), a planarization process may be performed to expose a top surface of the gate stack 304. For example, a planarization process includes a chemical mechanical planarization (CMP) process which removes portions of the ILD layer 802 (and CESL layer, if present) overlying the gate stack 304 and planarizes a top surface of the semiconductor device 200.

The method 100 then proceeds to block 118 where the dummy gate (see block 108) is removed. The gate electrode and/or gate dielectric may be removed by suitable etching processes. In some embodiments, block 118 also includes selective removal of the epitaxial layer(s) in the channel region of the device is provided. In embodiments, the selected epitaxial layer(s) are removed in the fin elements within the trench provided by the removal of the dummy gate electrode (e.g., the region of the fin on and over which the gate structure will be formed, or the channel region). Referring to the example of FIGS. 9A and 9B, the epitaxy layers 206 are removed from the channel region of the substrate 202 and within the trench. In some embodiments, the epitaxial layers 206 are removed by a selective wet etching process. In some embodiments, the selective wet etching includes HF. In an embodiment, the epitaxial layers 206 are SiGe and the epitaxial layers 208 are silicon allowing for the selective removal of the SiGe epitaxial layers 206.

The method 100 then proceeds to block 120 where a gate structure is formed. The gate structure may be the gate of a multi-gate transistor. The final gate structure may be a high-K/metal gate stack, however other compositions are possible. In some embodiments, the gate structure forms the gate associated with the multi-channels provided by the plurality of nanowires (now having gaps there between) in the channel region.

Figure 10B:
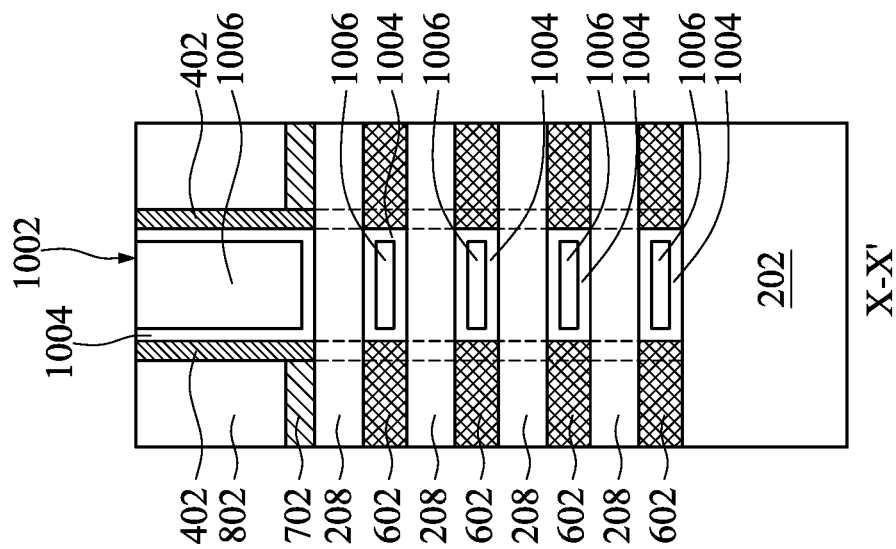
Figure 10A:
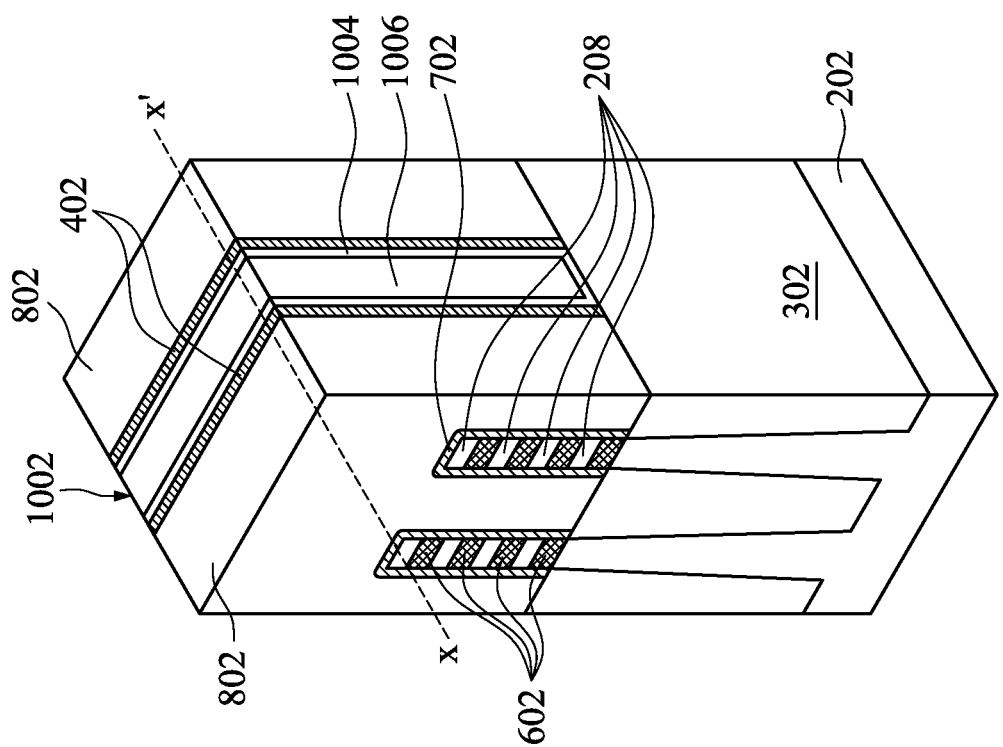

Referring to the example of FIGS. 10A and 10B, in an embodiment of block 120, a high-K/metal gate stack 1002 is formed within the trench of the device 200 provided by the removal of the dummy gate and/or release of nanowires, described above with reference to block 118. In various embodiments, the high-K/metal gate stack 1002 includes an interfacial layer, a high-K gate dielectric layer 1004 formed over the interfacial layer, and/or a metal layer 1006 formed over the high-K gate dielectric layer 1004. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack may include depositions to form various gate materials, one or more liner layers, and one or more CMP processes to remove excessive gate materials and thereby planarize a top surface of the semiconductor device 200.

In some embodiments, the interfacial layer of the gate stack 1002 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable methods. The gate dielectric layer 1004 of the gate stack 1002 may include a high-K dielectric layer such as hafnium oxide ($HfO_2$). Alternatively, the gate dielectric layer 1004 of the gate stack 1002 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 1002 may be formed by ALD, physical vapor deposition (PVD), CVD, oxidation, and/or other suitable methods. The metal layer of the high-K/metal gate stack 1002 may include a single layer or alternatively a multilayer structure, such as various combinations of a metal layer with a selected work function to enhance the device performance (work function metal layer), a liner layer, a wetting layer, an adhesion layer, a metal alloy, or a metal silicide. By way of example, the metal layer of gate stack 1002 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer of the gate stack 1002 may be formed by ALD, PVD, CVD, e-beam evaporation, or other suitable processes. Further, the metal layer of the gate stack 1002 may be formed separately for N-FET and P-FET transistors which may use different metal layers. In various embodiments, a CMP process may be performed to remove excessive metal from the metal layer of the gate stack 1002, and thereby provide a substantially planar top surface of the metal layer of the gate stack 1002. The metal layer 1006 of the gate stack 1002 is illustrated in FIGS. 10A and 10B. In addition, the metal layer may provide an N-type or P-type work function, may serve as a transistor (e.g., FinFET) gate electrode, and in at least some embodiments, the metal layer of the gate stack 1002 may include a polysilicon layer. The gate structure 1002 includes portions that interpose each of the epitaxial layers 306, which each form channels of the multi-gate device 200.

The method 100 then proceeds to block 122 wherein further fabrication is performed. A semiconductor device may undergo further processing to form various features and regions known in the art. For example, subsequent processing may form contact openings, contact metal, as well as various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 11:
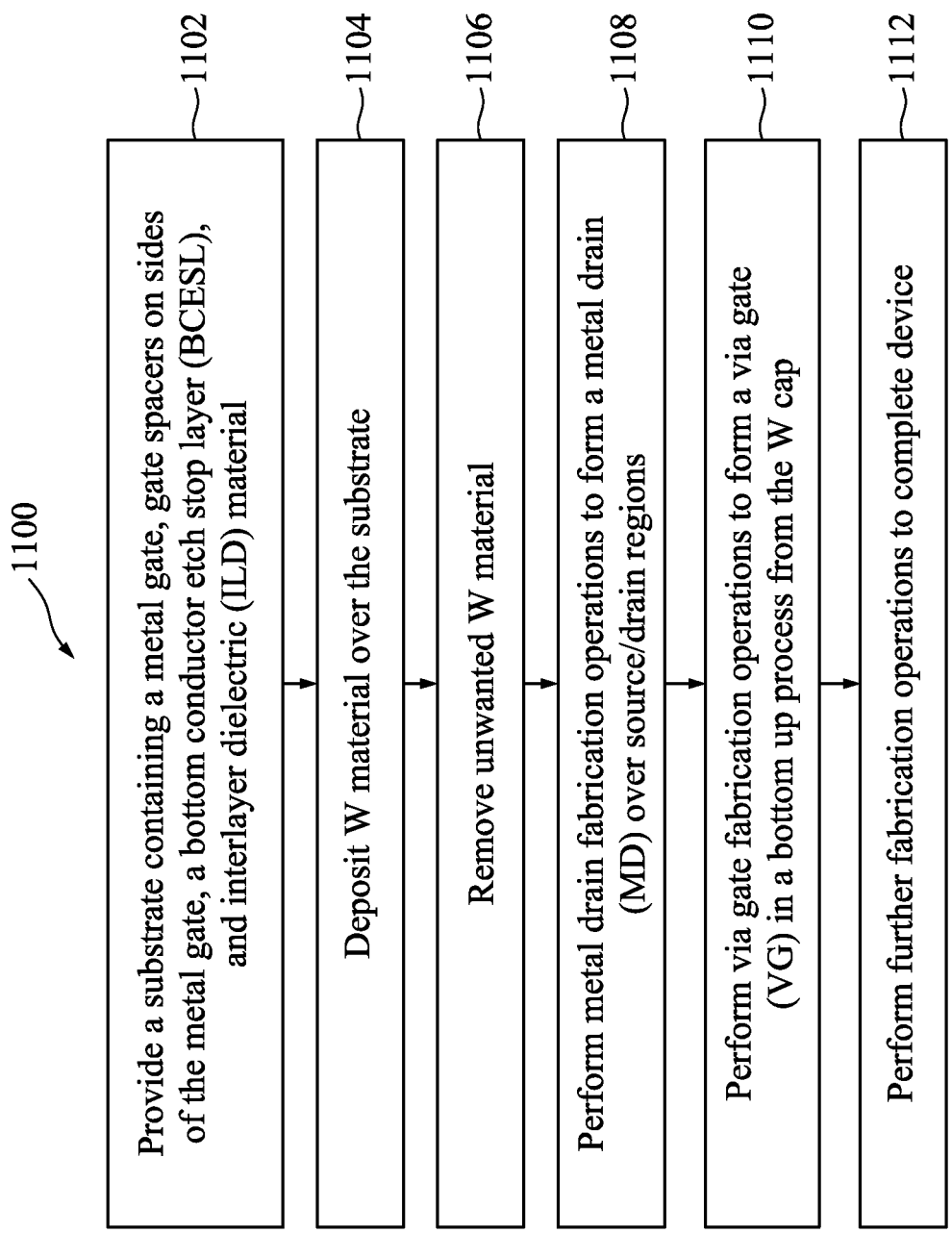
FIG. 11 is a flow chart depicting an example method for fabricating a Tungsten (W) cap over a metal gate for use with a subsequently fabricated VIA gate (VG) conductor, in accordance with some embodiments.

FIG. 11 is a flow chart depicting an example fabrication method 1100 that includes fabricating a metal cap for use with a subsequently fabricated VIA gate (VG) conductor. FIG. 11 is described in conjunction with FIGS. 12A-12F, which are diagrams depicting enlarged views of an example area 1200 (corresponding to the top portions shown in FIGS. 2B-10B) at various stages of fabricating a Tungsten (W) cap above a metal gate, in accordance with some embodiments. In some figures, some reference numbers of components or features illustrated therein may be omitted to avoid obscuring other components or features; this is for ease of depicting the figures. The process 1100 is merely an example, and is not intended to limit the present disclosure beyond what is explicitly recited in the claims. Additional steps may be provided before, during, and after example process 1100, and some of the steps described can be moved, replaced, or eliminated for additional embodiments of example process 1100. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure.

Figures 12A, 12B, 12C:
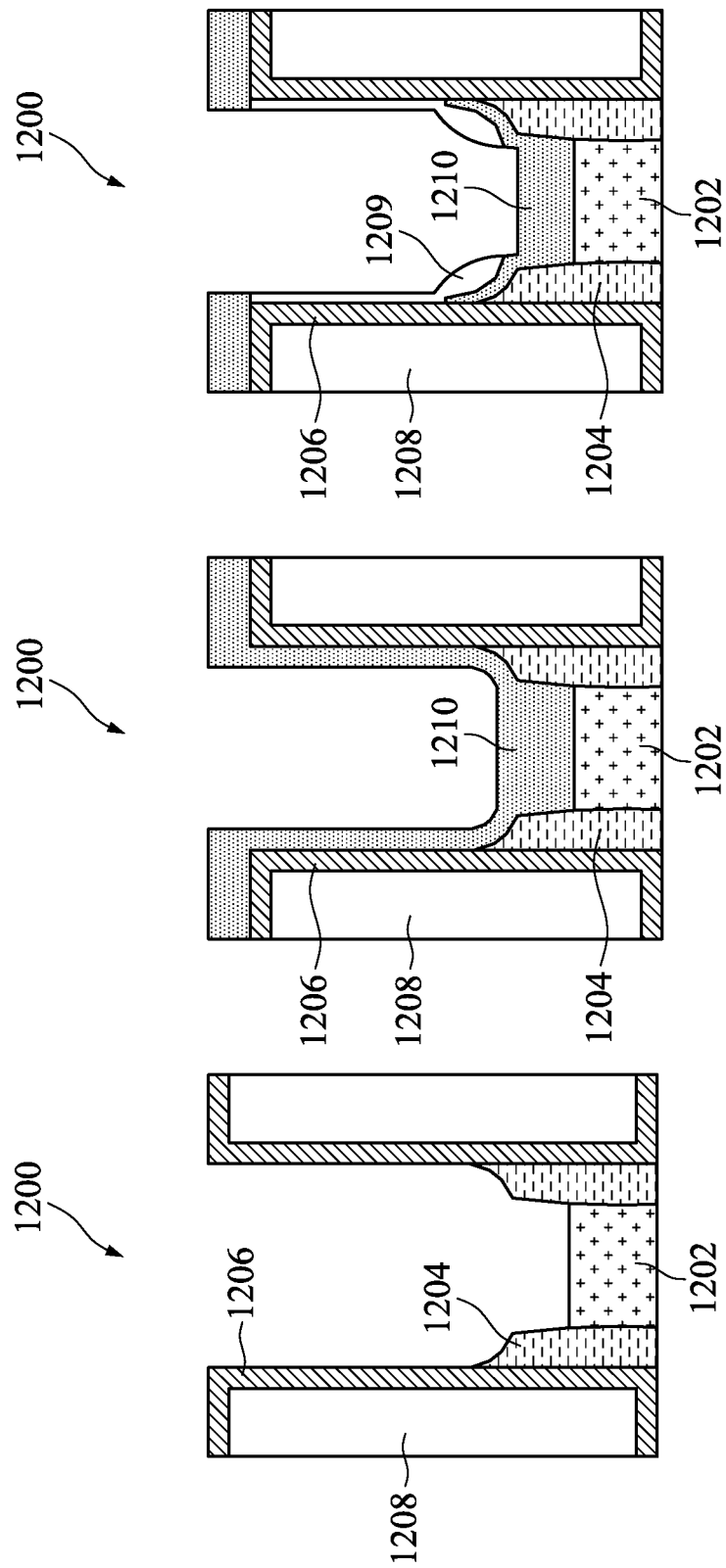

At block 1102, the example method 1100 includes providing a substrate containing a metal gate, gate spacers on sides of the metal gate, a bottom conductor etch stop layer (BCESL), and interlayer dielectric (ILD) material. FIG. 12A illustrates an example area 1200 (corresponding to the top portions shown in FIGS. 2B-10B) after metal gate formation. Depicted are a metal gate (MG) 1202 (e.g., gate stack 1002), gate spacers 1204 (e.g., spacers 402), a bottom conductor etch stop layer (BCESL) 1206, and interlayer dielectric (ILD) material 1208 (e.g., ILD 802).

It is known to use a glue layer as an interconnect material between the metal gate 1202 and a conductive plug (also known as a VIA gate or VG) that is subsequently fabricated to provide a connection to the MG 1202. The subject matter described herein discloses apparatus, systems, techniques, and articles for using a metal cap as an intermediary between the MG 1202 and a conductive plug instead of a glue layer. A metal cap formed of a Tungsten (W) containing composition (referred to herein as W material) can serve as an intermediary with a lower resistance than a glue layer based intermediary.

At block 1104, the example method 1100 includes depositing W material over the substrate. The W material may be deposited using a PVD process at a pressure of about 150 to about 250 mT. FIG. 12B illustrates the example area 1200 after W material deposition. As depicted, W material 1210 is deposited over the MG 1202, around sidewalls of the gate spacers 1204, along sidewalls of the BCESL 1206, and on top of the BCESL 1206.

FIG. 12C illustrates the area 1200 after W material deposition, but also illustrates that some of the deposited W may interact with the sidewalls to form tungsten oxide (WOx) 1209 on the sidewalls. In some examples, WOx formation may account for about 63-100% of the W material formed on the sidewalls, whereas WOx formation may account for about 17% of the W material formed on top of the BCESL 1206 and on top of the MG 1202.

At block 1106, the example method 1100 includes removing unwanted W material. The W material may be removed in various stages. In one stage, WOx may be removed. The WOx may be removed via wet etching operations using an ammonium solution, such as a NH$_4$OH solution. This can result in substantially all of the WOx being removed from the sidewalls of the BCESL 1206 and the sidewalls of the gate spacers 1204 with small impact on the thickness of the W material 1210 over the MG 1202. In an embodiment, wet etching operations using an ammonium solution includes using NH$_4$OH at a concentration of 1:1 to approximately 1:50 at about 50° to about 70° C.

FIG. 12D illustrates the area 1200 after WOx removal from the sidewalls. In this example, W material 1210 remains on top of the BCESL 1206 and on top of the MG 1202, with substantially all (e.g., 95-100%) of the W material removed from the sidewalls of the BCESL 1206 and a substantial amount (e.g., >63%) removed from the sidewalls of the gate spacers 1204 and with small impact on the thickness 1211 of the W material 1210 over the MG 1202. This can allow for greater thickness 1211 of a W cap after a further etching operations to remove the W material from the top of BCESL 1206 and the sidewalls of the gate spacers 1204.

In a second stage of removing the unwanted W material, wet etching operations using an ozone solution may be employed to remove the W material from the top of BCESL 1206 and the sidewalls of the gate spacers 1204. The W material may be removed via wet etching operations using an ozone solution, such as a DIO$_3$ solution. This can result in the W material forming a W cap that can be used as an intermediary between a subsequently formed VG and the MG. In an embodiment, wet clean operations using an ozone solution includes using DIO$_3$ at a concentration approximately 5 to 100 ppm, at room temperature.

Removing the unwanted W material may additionally or alternatively include removing the W material from the top of BCESL 1206, the sidewalls of the BCESL 1206, and the sidewalls of the gate spacers 1204 via wet etching operations using a mixture comprising an ozone component, such as a DIO$_3$ solution and hydrochloric acid (HCL).

Wet clean operations using an ozone solution alone to remove the W material from the top of BCESL 1206, the sidewalls of the BCESL 1206, and the sidewalls of the gate spacers 1204 may be insufficient in some applications to remove all of the W material from the sidewalls of the BCESL 1206 and the sidewalls of the gate spacers 1204—a W material residue may remain, which could potentially create a short risk between the MG and a subsequently formed source/drain contact (referred to herein as MD).

Wet clean operations using an ozone solution alone to remove the W material from the top of BCESL 1206, the sidewalls of the BCESL 1206, and the sidewalls of the gate spacers 1204 may alternatively result in too much of the W material from the top of the MG 1202 being removed to eliminate the W material on the sidewalls thus thwarting some of the advantages (e.g., lower resistance) of a W cap as an intermediary versus using a glue layer as an intermediary.

Wet clean operations with a solution containing both an ozone solution and HCL can result in removal of the W material from the top of BCESL 1206, the sidewalls of the BCESL 1206, and the sidewalls of the gate spacers 1204 without too much removal of the W material from the top of the MG 1202. The HCl can be more effective at removing the W material that intermixed with BCESL 1206 than the ozone solution alone resulting in reduced etching time and reduced etching of the W material from the top of the MG 1202. This can allow for greater thickness 1211 of a W cap.

In an embodiment, wet clean operations using a solution comprising ozone and hydrochloric acid mixed in water (DIO$_3$+hydrochloric acid (HCl)) to create a W cap on the MG is used. This mixture reduces the possibility formation of a residue antenna extending above the gate spacer which if present could create a short risk to a subsequently formed MD. In an example, the solution includes DIO$_3$ with a concentration of 5 to 100 ppm at room temperature and HCl with a concentration of 1:1 to approximately 1:50 at about 25° to about 50° C. The W cap is formed with a thickness in the range of 2 to about 10 nm without residue above the gate spacer.

FIG. 12E illustrates the area 1200 after formation of a W cap 1212 that can be used as an intermediary between a subsequently formed VG and the MG 1202. The W cap 1212 may be formed using various combinations of (a) via wet etching operations using an ammonium chemical, such as a NH$_4$OH solution; (b) wet etching operations using ozone (e.g., DIO$_3$); and/or (c) wet etching operations using a solution comprising ozone and hydrochloric acid mixed in water (DIO$_3$+hydrochloric acid (HCl)). The W cap 1212 may be formed with a thickness in the range of 2 to about 10 nm without residue above the gate spacer.

The example method 1100, at block 1108, includes performing metal drain fabrication operations to form a metal drain (MD) over source/drain regions and, at block 1110, includes performing VIA gate fabrication operations to form a VIA gate (VG) in a bottom up process from the W cap 1212. The W cap 1212 can provide an interconnect between the MG 1202 and the VG 1214 with a lower resistance than would be achieved using a glue layer as an interconnect.

Metal drain fabrication operations (block 1108) may include forming a patterned mask over the area 1200 and exposing a portion of the ILD layer 1208. The patterned mask may include a photo resist layer. The patterned mask may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer includes a hard mask layer. The hard mask layer includes an oxide material, silicon nitride, silicon oxynitride, an amorphous carbon material, silicon carbide or tetraethylorthosilicate (TEOS).

Metal drain fabrication operations (block 1108) may further include removing the exposed portion of the ILD layer 1208 to form an opening that exposes an underlying source/drain structure. The exposed portion of the ILD layer 1208 can be removed by suitable etching process, such as wet etching, dry etching, or combination thereof. During etching the ILD layer 1208, the etchant is selected to provide etching selectivity between ILD layer 1208 and other structures, such as the gate spacers 1204 and the W cap 1212. For example, ILD layer 1208 has lower etching resistance to the etchant than the gate spacers 1204 and the W cap 1212, such that the ILD layer 1208 can be etched while keeping the gate spacers 1204 and the W cap 1212 substantially intact.

Metal drain fabrication operations (block 1108) may further include removing the patterned mask and forming a source/drain contact 1216 in the opening. Forming a source/drain contact 1216 in the opening may include filling a conductive material in the openings contacting the source/drain regions to form source/drain contact 1216. The source/drain contact 1216 may comprise one or more layers. For example, in some embodiments, the source/drain contact 1216 comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact 1216 in the opening.

VIA gate fabrication operations (block 1110) may include forming an opening through interlayer dielectric (ILD) material to contact the W cap 1212. The opening for the VIA gate fabrication operations may be formed using acceptable photolithography and etching techniques. The VIA gate can be deposited by CVD, ALD, electroless deposition (ELD), PVD, electroplating, or another deposition technique.

FIG. 12F illustrates the area 1200 after formation of a VG 1214. Depicted are the MG 1202, gate spacers 1204, a bottom conductor etch stop layer (BCESL) 1206, the VG 1214, metal source/drain (MD) conductors 1216, and interlayer dielectric (ILD) material 1218. The VG 1214 may be or comprise tungsten, cobalt, copper, ruthenium, aluminum, gold, silver, alloys thereof, the like, or a combination thereof. The MD 1216 may be copper, a copper alloy, silver, gold, tungsten, cobalt, aluminum, ruthenium, nickel, or the like. The ILD 1218 is a low k material such as an oxide.

The example method 1100 includes, at block 1112, performing further fabrication operations. A semiconductor device may undergo further processing to form various features and regions known in the art. For example, subsequent processing may form contact openings, contact metal, as well as various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1100, and some process steps described above may be replaced or eliminated in accordance with various embodiments of the method 1100.

Figure 13:
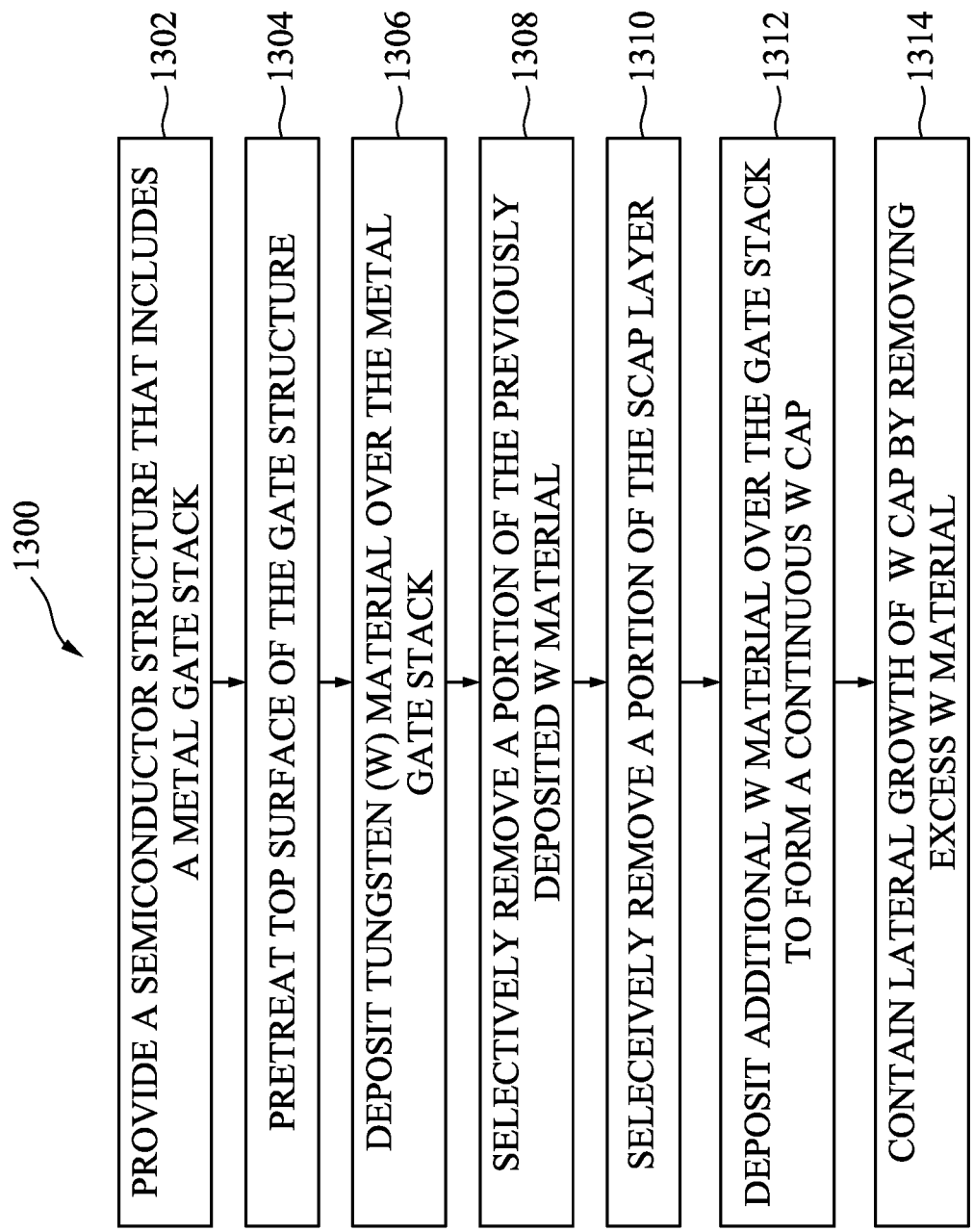
FIG. 13 is a flow chart depicting another example method for fabricating a Tungsten (W) cap over a metal gate for use with a subsequently fabricated VIA gate (VG) conductor, in accordance with some embodiments.

FIG. 13 is a process flow chart depicting an example process 1300 for forming a metal cap for use with a subsequently formed VIA gate (VG) conductor, according to various aspects of the present disclosure. FIG. 13 is described in conjunction with FIGS. 14A-14E, 15A-15B, and 16A-16B, which are cross-sectional views of a semiconductor device, which illustrate the semiconductor device at various stages of fabrication in accordance with some embodiments of the present disclosure of the example process 1300. The process 1300 is merely an example, and is not intended to limit the present disclosure beyond what is explicitly recited in the claims. Additional steps may be provided before, during, and after example process 1300, and some of the steps described can be moved, replaced, or eliminated for additional embodiments of example process 1300. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure.

FIGS. 14A-14E schematically illustrates a portion of an example semiconductor device in a two-dimensional view along a cutline in a Y-axis plane at various stages of fabrication. In some figures, some reference numbers of components or features illustrated therein may be omitted to avoid obscuring other components or features; this is for ease of depicting the figures. Other aspects not illustrated in or described with respect to FIGS. 14A-14E may become apparent from the following figures and description. The semiconductor device may be part of an IC, such as a microprocessor, memory cell (such as static random-access memory (SRAM)), and/or other integrated circuits.

At block 1302, the example process 1300 includes providing a semiconductor structure that includes a gate stack. In various embodiments, the gate structure includes a low-k (LK) dielectric layer (or gate spacers) and a gate stack. The gate stack includes a high-k (HK) dielectric layer, a p-metal gate (PMG) layer (e.g., p-type work function metal layer), an n-metal gate (e.g., TiAl) layer (e.g., n-type work function metal layer), a silicon cap (scap) layer, and a glue (e.g., TiN) layer.

Figure 14B:
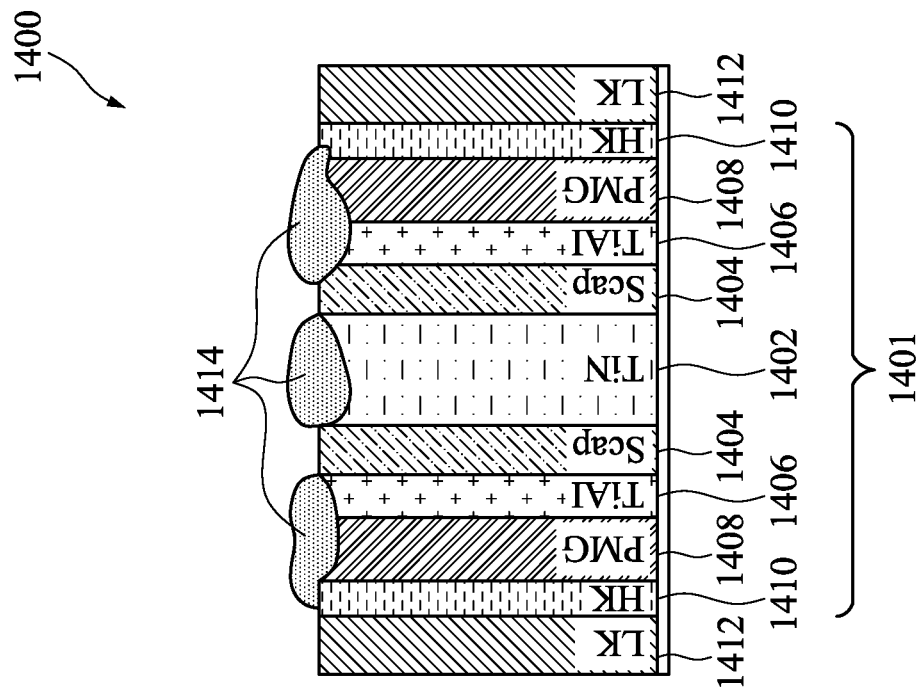
FIGS. 14A-14E are diagrams depicting enlarged views of an example semiconductor gate structure at various stages of fabricating a continuous metal cap above a metal gate, in accordance with some embodiments.
Figure 14A:
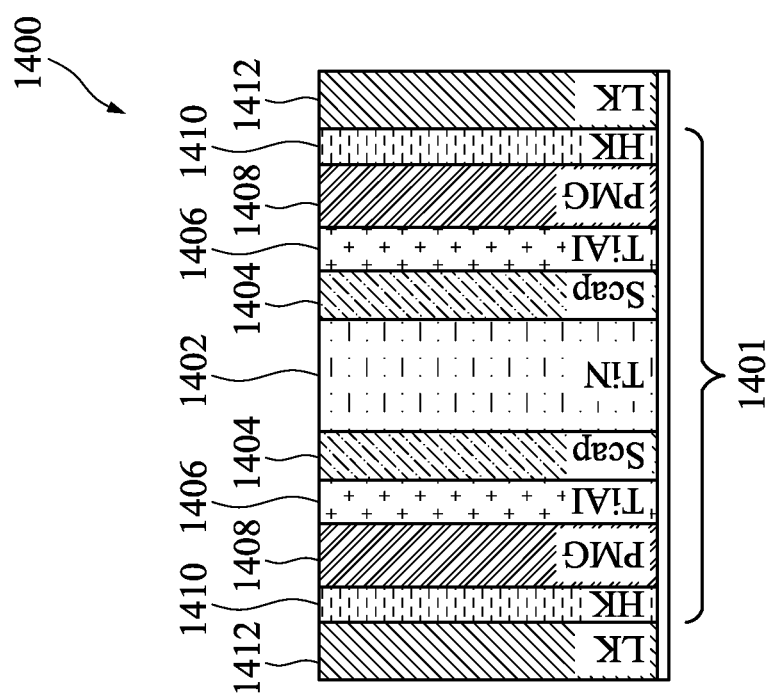

Referring to the example of FIG. 14A, in an embodiment of block 1302, a gate structure 1400 includes an LK dielectric layer 1412 and a gate stack 1401. The gate stack 1401 includes a HK dielectric layer 1410, a PMG layer 1408, an n-metal gate (e.g., TiAl) layer 1406, a silicon cap (scap) layer 1404, and a glue (e.g., TiN) layer 1402. In various embodiments, the thickness of the HK dielectric layer 1410 is about 5 angstroms (A) to about 40 A, the thickness of PMG layer 1408 is about 5 A to about 40 A, the thickness of the n-metal gate layer 1406 is about 5 A to about 40 A, the thickness of the scap layer 1404 is about 5 A to about 40 A, and the thickness of the glue layer 1402 is about 10 A to about 150 A.

The gate stack 1401 may be formed for either an n-channel metal-oxide semiconductor (NMOS) or a p-channel metal-oxide semiconductor (PMOS) and may contain one or more work function metal layers. In embodiments using an NMOS semiconductor device, the gate stack 1401 may contain both an N-metal layer 1406 and a P-metal layer 1408, or the gate stack 1401 may contain only an N-metal layer 1406 and no P-metal layer 1408. In embodiments using a PMOS semiconductor device, the gate stack 1401 may contain both an N-metal layer 1406 and a P-metal layer 1408, or the gate stack 1401 may contain only a P-metal layer 1408 and no N-metal layer 1406.

In various embodiments, the scap layer 1404 is included in the gate stack 1401 to inhibit oxygen from penetrating the PMG layer 1408, the n-metal gate layer 1406, and the HK dielectric layer 1410 to prevent oxidation of the work function metal layers, thereby preventing threshold voltage ($V_t$) changes and improving overall device performance. In various embodiments, the scap layer 1404 includes silicon material such as $SiO_x$. In various embodiments, the scap layer 1404 is formed by soaking the metal gate in a silane solution. The scap layer 1404 may protect the P-metal 1408 and the N-metal 1406 from the etching process, may improve the properties of the metal gate such as the threshold voltage ($V_t$), and may prevent $V_t$ degradation.

At block 1304, the example process 1300 includes pre-treating the top surface of the gate structure to prepare the surface for subsequent deposition operations and to ensure selective deposition of tungsten on the metal gate. In various embodiments, the pretreatment is an oxygen ($O_2$ gas) plasma treatment. The oxygen plasma treatment may also include an amount of helium gas. In various embodiments, the pretreatment includes an $O_2$ gas plasma treatment at a pressure of about 1000 Torr to about 2500 Torr and at a power of about 1000 W to about 3000 W.

At block 1306, the example process 1300 includes depositing tungsten (W) material over the metal gate stack. The tungsten material may be deposited by CVD, ALD, electroless deposition (ELD), PVD, electroplating, a combination thereof, or another deposition technique.

Deposition of the W material results in W forming on each layer of the metal stack except for the scap layer. The scap layer inhibits the deposition of the tungsten material because of the high concentration of silicon material in the scap layer. Thus, a discontinuous tungsten cap is formed over the gate stack.

Referring to the example of FIG. 14B, in an embodiment of block 1306, a discontinuous W cap 1414 (e.g., a first W layer 1414) has formed over the gate stack 1401. Little if any of the W material has formed over the scap layer 1404 due to the silicon content of the scap layer 1404 inhibiting W cap formation. The scap layer 1404 inhibits tungsten cap coverage because of the dielectric properties of silicon containing material. In various embodiments, the thickness of the discontinuous metal cap 1414 is about 1-2 nm.

In various embodiments, the W material used in the W cap 1414, and later to form the continuous tungsten cap 1418, is substantially fluorine free tungsten (FFW). FFW material may be formed using a non-fluorine based precursor. This may be used because the presence of fluorine in the metal gate can affect the threshold voltage ($V_t$) and may negatively affect device performance. FFW may contain an amount of fluorine contaminants less than 5 atomic percent and an amount of chlorine contaminants greater than 3 atomic percent (e.g., about 5 atomic percent, about 7 atomic percent, about 10 atomic percent). The FFW may be deposited by ALD or CVD using one or more non-fluorine based W precursors such as, but not limited to, tungsten pentachloride ($WCl_5$) or tungsten hexachloride ($WCl_6$).

At block 1308, the example process 1300 includes selectively removing a portion of the previously deposited W material. The portion of the tungsten material that was deposited on the gate stack and that covered a portion of the scap layer is removed via etching operations. This selective removal of the deposited W material exposes the scap layer for subsequent fabrication operations. In various embodiments, the tungsten material is removed via wet etching operations using a solution of ozone in water ($DIO_3$). The concentration of the ozone solution may be about 10 ppm to about 100 ppm. The etching process may be carried out at room temperature.

At block 1310, the example process 1300 includes selectively removing a portion of the scap layer to create a recess in the top surface of the scap layer. The portion of the scap layer in the top surface is removed to allow deposition of additional tungsten material in later operations to create a continuous tungsten cap over the gate stack. In various embodiments, the portion of the top surface of the scap layer is removed via wet etching operations using a using dilute hydrofluoric acid (dHF). The dHF is a solution of HF in water. In various embodiments, the ratio of HF to water is about 1:100 to about 1:500. In various embodiments, the temperature of the solution is about 25° C. to about 50° C.

The discontinuous tungsten cap 1414 functions as an etching mask during the selective removal of the portion of the scap layer 1404 to create the recess 1416 in the top surface of the scap layer 1404. The discontinuous tungsten cap 1414 can help ensure that the PMG layer 1408 and the n-metal gate layer 1406 are not damaged during etching of the scap layer 1404.

Figure 14D:
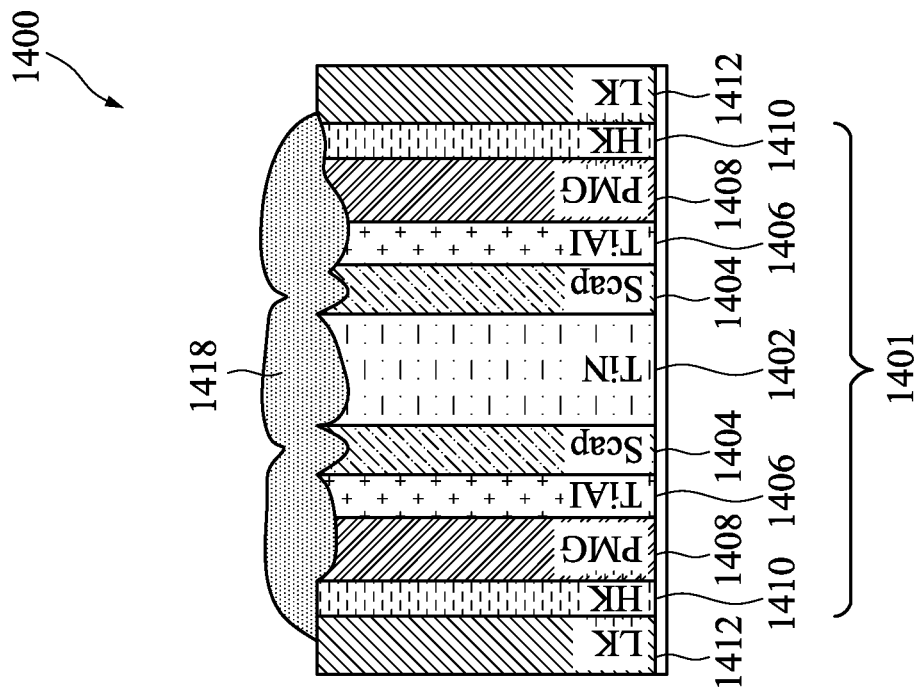
Figure 14C:
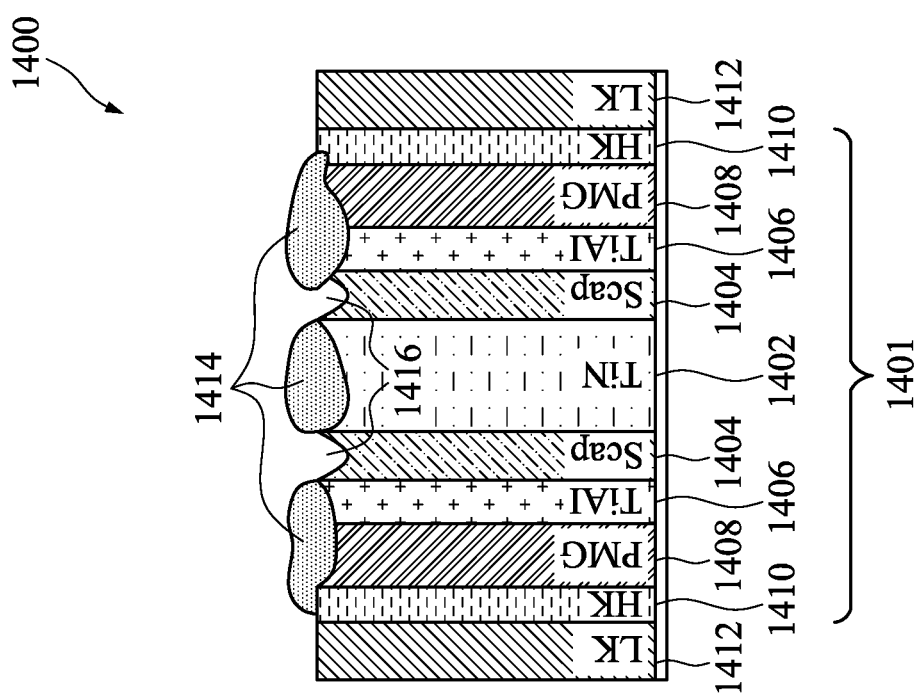

Referring to the example of FIG. 14C, in an embodiment of block 1310, the scap layer 1404 includes a recess 1416 in the top surface of the scap layer 1404.

At block 1312, the example process 1300 includes depositing additional W material (e.g., a second W layer) over the gate stack to form a continuous W cap 1418. The additional W material may be deposited by CVD, ALD, electroless deposition (ELD), PVD, electroplating, a combination thereof, or another deposition technique. Because of the recess 1416, W material forms over the scap layer 1404 and fills the recess 1416. In various embodiments, the addition W material used in the W cap 1418 is substantially fluorine free tungsten (FFW).

In an exemplary embodiment, the tungsten material is deposited through ALD operations. The deposition operations are controlled to obtain a desired thickness of the W cap 1418. In some embodiments, the total thickness of the tungsten cap 1418 is about 1-2 nm. At this stage in the process, the W material may also partially cover the low-k dielectric spacers 1412.

Referring to the example of FIG. 14D, in an embodiment of block 1312, a continuous W cap 1418 has been formed over the gate structure 1400 including in the recess 1416 and partially over the LK dielectric layer 1412.

At block 1314, the example process 1300 includes containing the lateral growth of the W cap 1418 by removing excess W material. In various embodiments, the excess W material is removed using a wet etching process. The reduction of the lateral growth of the W cap 1418 confines the W cap to the region over the metal gate stack 1401 but not over the LK dielectric layer 1412. This can reduce a leak risk. In various embodiments, lateral etch back of the W cap 1418 is completed using a solution of ozone in water ($DIO_3$). The concentration of the ozone solution may be about 10 ppm to about 100 ppm. The temperature of the solution may be about room temperature. The process 1300 results in the formation of a continuous W cap 1418 covering the gate stack 1401.

Figure 14E:
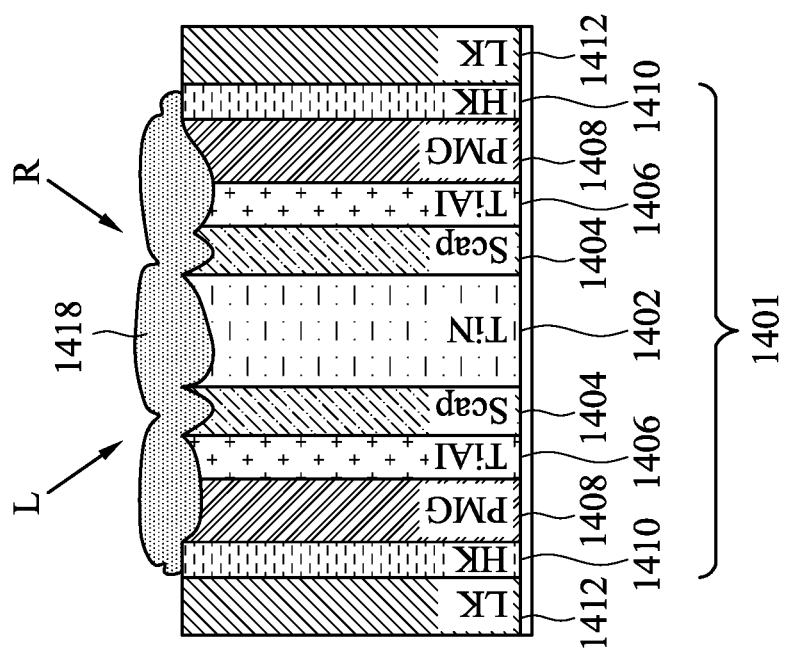

Referring to the example of FIG. 14E, in an embodiment of block 1314, the continuous W cap 1418 is confined to the gate stack 1401 and does not cover the LK dielectric layer 1412.

Figure 15A:
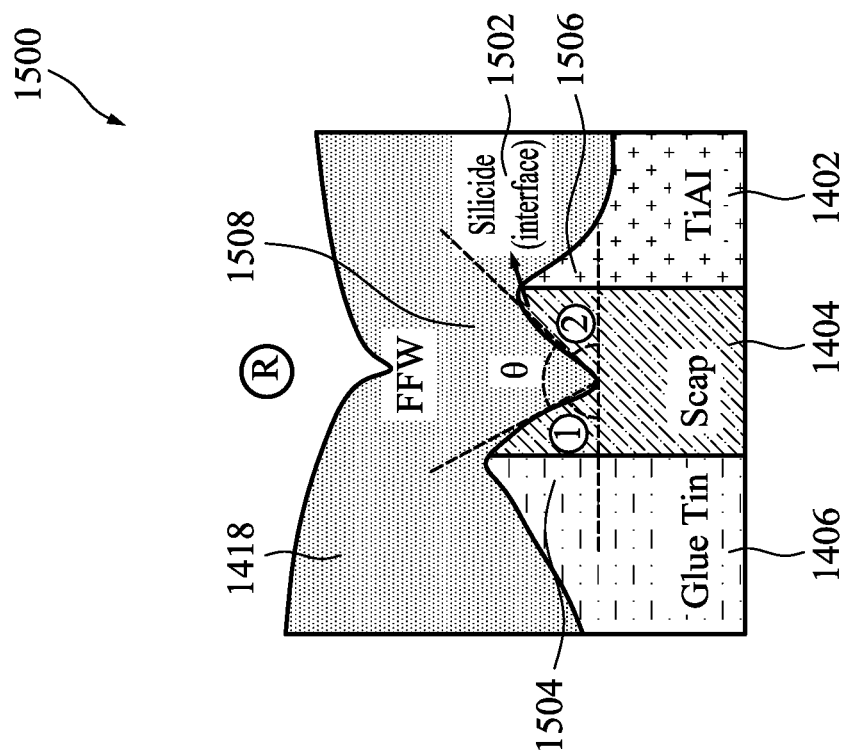
FIGS. 15A and 15B depict angles found within a portion of the gate structure after formation of a metal cap, on the left and right sides of the gate structure, respectively.
Figure 15B:
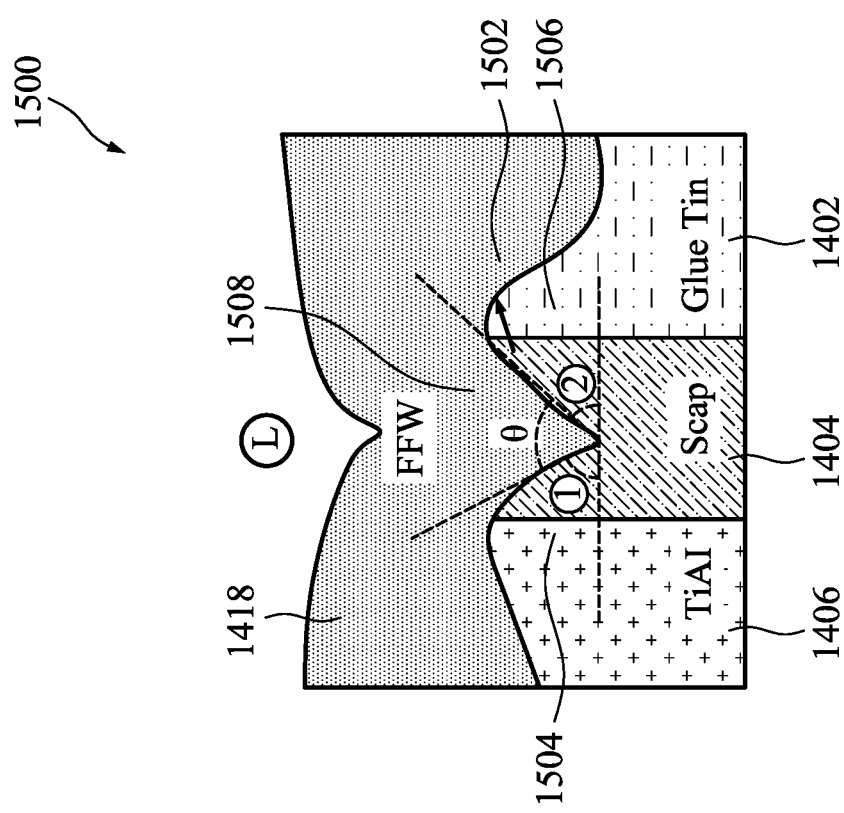

FIGS. 15A-15B are cross-sectional views of a portion 1500 of the gate structure 1400, which illustrate example angles between the scap layer 1404 and the tungsten cap 1418 defined by the recess formed in the scap layer 1404. FIG. 15A illustrates example angles that may be formed on the left side of the gate structure 1400, and FIG. 15B illustrates example angles that may be formed on the right side of the gate structure 1400.

A silicide layer 1502 is formed at the interface of the scap layer 1404 and the tungsten cap 1418 resulting from depositing additional W material over the gate stack 1401 to form the continuous W cap 1418 (e.g., at block 1312). The region around the silicide layer 1502 is defined by a first angle 1504, a second angle 1506, and a third angle 1508. The first angle 1504 is the angle between a horizontal plane of the gate stack and a first edge of the silicide layer 1502. The second angle 1506 is the angle between the horizontal plane of the gate stack and a second edge of the silicide layer 1502. The third angle 1508 is the angle between the first edge of the silicide layer 1502 and the second edge of the silicide layer 1502.

In various embodiments, there is no significant difference between the angles in FIG. and the angles in FIG. 15B. The angle 1504 in FIG. 15A has substantially the same magnitude (e.g., with 10%) as the angle 1504 in FIG. 15B. The angle 1506 in FIG. 15A has substantially the same magnitude (e.g., with 10%) as the angle 1506 in FIG. 15B. The angle 1508 in FIG. 15A has substantially the same magnitude (e.g., with 10%) as the angle 1508 in FIG. 15B.

In various embodiments, the angle 1504 ranges from about 10° to about 70°, the angle 1506 ranges from about 10° to about 70°, and the angle 1508 ranges from about 40° to about 160°. In all embodiments, the angle 1508 is equal to 180° minus the sum of the angles 1504 and 1506.

Further fabrication operations may be performed after forming the continuous W cap 1418, such as metal drain fabrication operations, VIA gate fabrication operations, and further processing to form various features and regions known in the art. For example, subsequent processing may form contact openings, contact metal, as well as various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multi-layer interconnection structure. Moreover, additional process steps may be implemented before, during, and after the method 1300, and some process steps described above may be replaced or eliminated in accordance with various embodiments of the method 1300.

Figure 16B:
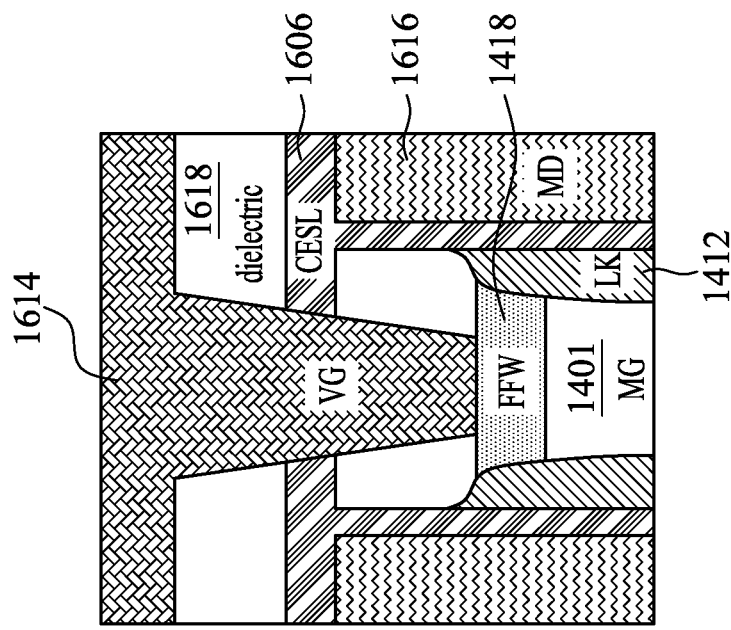
FIGS. 16A and 16B depict a y-cut and an x-cut, respectively, of the semiconductor device after addition of the tungsten cap and the VIA gate.
Figure 16A:
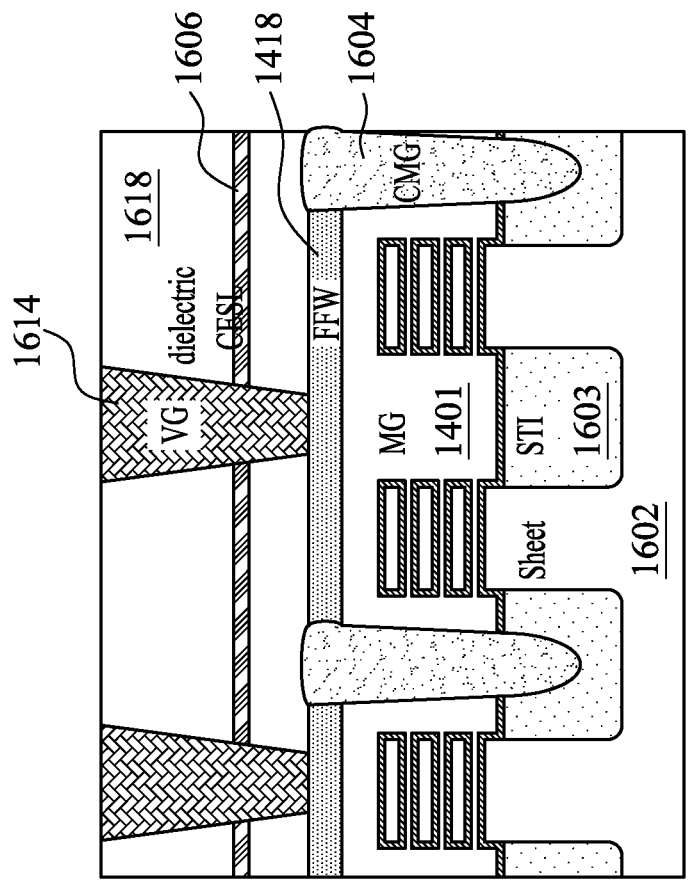

FIGS. 16A-16B are cross-sectional views of an example semiconductor device after forming a continuous W cap and VIA gate fabrication operations. FIG. 16A illustrates a portion of an example semiconductor device in a two-dimensional view along a cutline in an X-axis plane, and FIG. 16B illustrates a portion of the example semiconductor device in a two-dimensional view along a cutline in a Y-axis plane.

Depicted are a substrate 1602, STI 1603, a cut metal gate (CMG) dielectric layer 1604, a bottom conductor etch stop layer (BCESL) 1606, MG 1401, gate spacers 1412, a W cap 1418, a VG 1614, metal source/drain (MD) conductors 1616, and interlayer dielectric (ILD) material 1618. The VG 1614 may be or comprise tungsten, cobalt, copper, ruthenium, aluminum, gold, silver, alloys thereof, the like, or a combination thereof. The MD conductors 1616 may be copper, a copper alloy, silver, gold, tungsten, cobalt, aluminum, ruthenium, nickel, or the like. The ILD material 1618 is a low k material such as an oxide.

Figure 17:
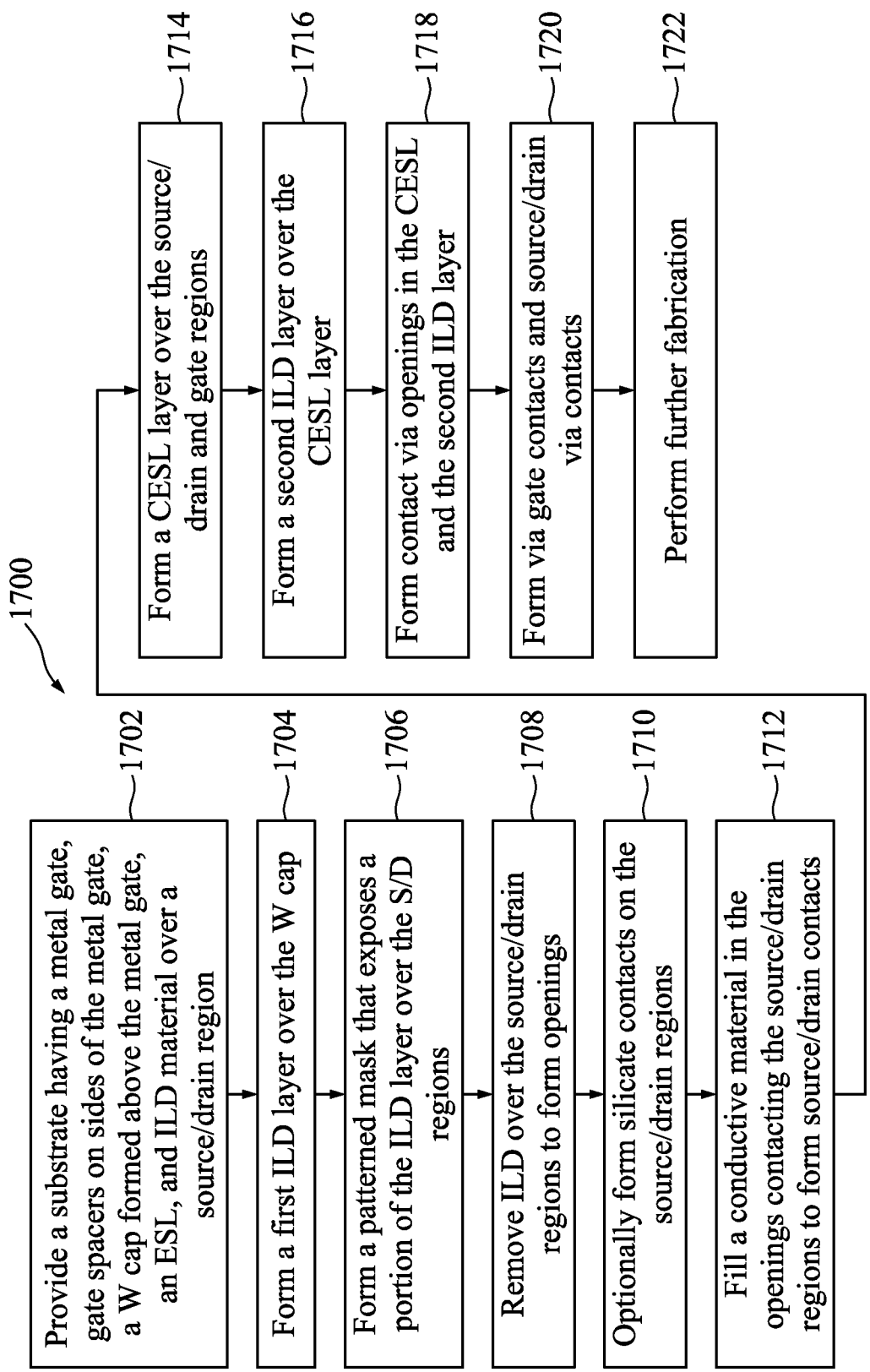
FIG. 17 is a process flow chart depicting an example method of semiconductor fabrication including metal drain fabrication and VIA gate fabrication, in accordance with some embodiments.

FIG. 17 is a process flow chart depicting an example method 1700 of semiconductor fabrication including metal drain fabrication and VIA gate fabrication, in accordance with some embodiments. The method 1700 is merely an example and is not intended to limit the present disclosure beyond what is explicitly recited in the claims. Additional steps may be provided before, during, and after method 1700, and some of the steps described can be moved, replaced, or eliminated for additional embodiments of method 1700. Additional features may be added in the integrated circuit depicted in the figures, and some of the features described below can be replaced, modified, or eliminated in other embodiments.

FIG. 17 illustrates example operations that may be performed between block 1108 and block 1110 of FIG. 11, in accordance with some embodiments. FIG. 17 is described in conjunction with FIGS. 18A-18E, wherein FIGS. 18A-18E are diagrams depicting expanded views of an example area 1800 (corresponding to areas shown in FIGS. 12E-12F) at various stages of semiconductor fabricating including metal drain fabrication and VIA gate fabrication, in accordance with some embodiments. In some figures, some reference numbers of components or features illustrated therein may be omitted to avoid obscuring other components or features; this is for ease of depicting the figures.

At block 1702, the example method 1700 includes providing a substrate having a metal gate, gate spacers on sides of the metal gate, a W cap formed above the metal gate, an etch stop layer (ESL), and interlayer dielectric (ILD) material over a source/drain region.

At block 1704, the example method 1700 includes forming a first ILD layer over the W cap. The first ILD layer may include or be a material such as silicon nitride (SiN), although other suitable materials, such as silicon oxide (SiO2), aluminum oxide (AlO), silicon oxycarbide (SiOC), silicon carbon (SiC), zirconium nitride (ZrN), zirconium oxide (ZrO), combinations of these, or the like, may also be utilized. The first ILD layer may be deposited using a deposition process such as plasma enhanced atomic layer deposition (PEALD), thermal atomic layer deposition (thermal ALD), plasma enhanced chemical vapor deposition (PECVD), or others. Any suitable deposition process and process conditions may be utilized.

At block 1706, the example method 1700 includes forming a patterned mask that exposes a portion of the ILD material over the source/drain regions. The patterned mask may include a photo resist layer. The patterned mask may be formed by photoresist coating (e.g., spin-on coating), soft baking, mask aligning, exposure, post-exposure baking, developing the photoresist, rinsing, drying (e.g., hard baking), and/or combinations thereof. In some other embodiments, various imaging enhancement layers may be formed under photo resist layer to enhance the pattern transfer. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer. In yet some other embodiments, the patterned mask layer includes a hard mask layer. The hard mask layer includes an oxide material, silicon nitride, silicon oxynitride, an amorphous carbon material, silicon carbide or tetraethylorthosilicate (TEOS).

Figure 18A:
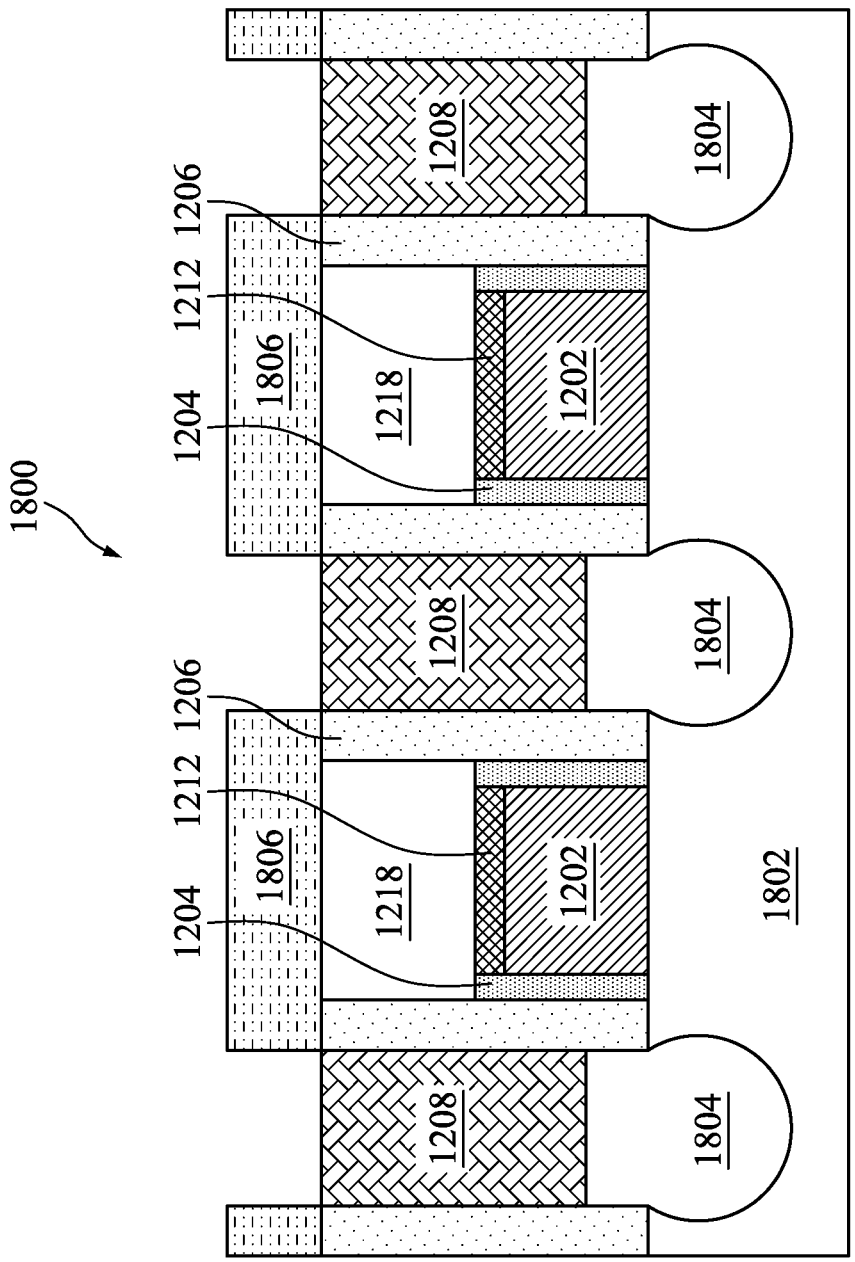
FIGS. 18A-18E are diagrams depicting expanded views of an example area of an example semiconductor device at various stages of semiconductor fabrication including metal drain fabrication and VIA gate fabrication, in accordance with some embodiments.

Referring to the example of FIG. 18A, in an embodiment after completion of blocks 1702, 1704, and 1706, an area 1800 including a substrate 1802 having a metal gate 1202, gate spacers 1204 on sides of the metal gate 1202, a W cap 1212 formed above the metal gate 1202, an ESL 1206, ILD material 1208 over a source/drain region 1804, a first ILD layer 1218 over the W cap 1212, and a patterned mask 1806 that exposes a portion of the ILD material 1208 over the source/drain regions 1804 is illustrated.

At block 1708, the example method 1700 includes removing ILD material over the source/drain regions to form openings that expose the underlying source/drain regions. The exposed portion of the ILD material can be removed by suitable etching process, such as wet etching, dry etching, or combination thereof.

At block 1710, the example method 1700 includes optionally forming silicide contacts on the source/drain regions that have been exposed. The optional silicide contact may comprise titanium (e.g., titanium silicide (TiSi)) in order to reduce the Schottky barrier height of the contact. However, other metals, such as nickel, cobalt, erbium, platinum, palladium, and the like, may also be used. A silicidation may be performed by blanket deposition of an appropriate metal layer, followed by an annealing step which causes the metal to react with the underlying exposed silicon of the source/drain regions.

Figure 18B:
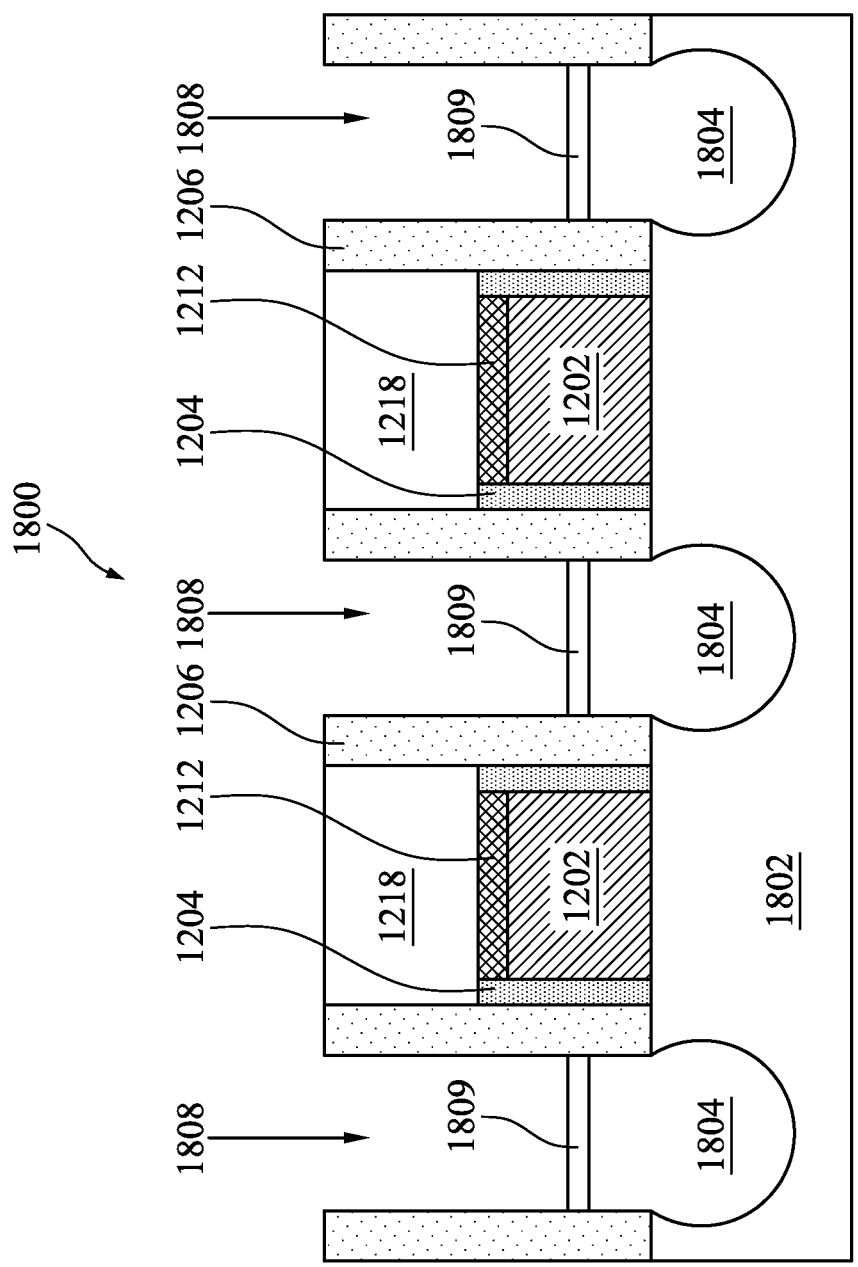

Referring to the example of FIG. 18B, in an embodiment after completion of blocks 1708 and 1710, the area 1800 includes openings 1808 that expose underlying source/drain regions 1804 and optionally formed suicide contacts 1809 on the source/drain regions 1804 that have been exposed. The figure depicts that the ILD material 1208 over the source/drain regions 1804 has been removed to form the openings 1808 that expose underlying source/drain regions 1804.

At block 1712, the example method 1700 includes filling a conductive material in the openings contacting the source/drain regions to form source/drain contacts. The source/drain contact 1216 may comprise one or more layers. For example, in some embodiments, the source/drain contact comprise a liner and a metal fill material (not individually shown) deposited by, for example, CVD, ALD, electroless deposition (ELD), PVD, electroplating, or another deposition technique. The liner, such as a diffusion barrier layer, an adhesion layer, or the like, may include titanium, titanium nitride, tantalum, tantalum nitride, or the like. The conductive material may be copper, a copper alloy, silver, gold, tungsten, cobalt, aluminum, ruthenium, nickel, or the like. A planarization process, such as a CMP, may be performed to remove excess liner and conductive material. The remaining liner and conductive material form the source/drain contact in the opening.

Figure 18C:
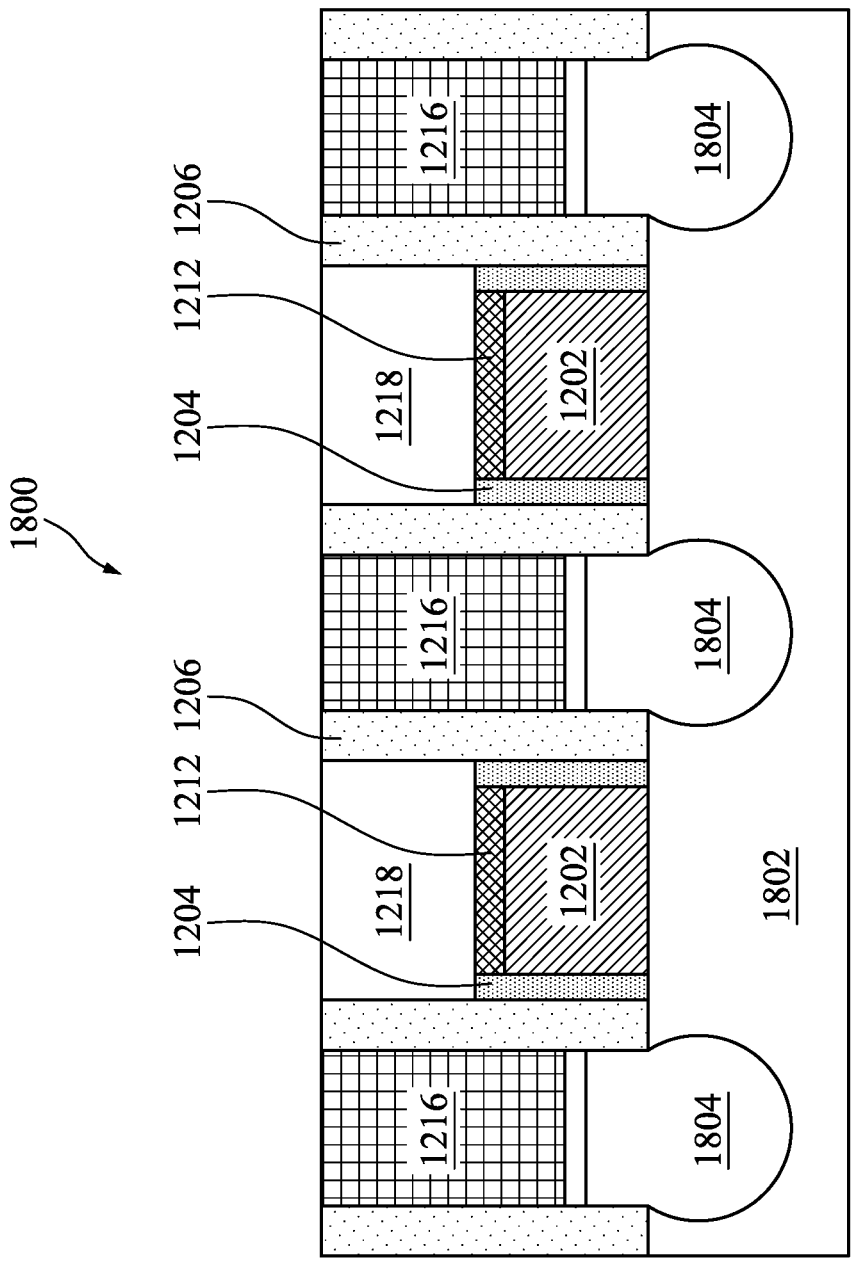

Referring to the example of FIG. 18C, in an embodiment after completion of block 1712, the area 1800 includes a conductive material filling the openings 1808 and contacting the source/drain regions 1804 to form source/drain contacts 1216.

At block 1714, the example method 1700 includes forming a contact etch stop layer (CESL) layer over the source/drain and gate regions. The CESL may be deposited using one or more low temperature deposition processes such as chemical vapor deposition, physical vapor deposition, or atomic layer deposition.

At block 1716, the example method 1700 includes forming a second ILD layer over the CESL layer. The second ILD layer may be formed of a dielectric material such as oxides (e.g., silicon oxide ($SiO_2$)) and may be deposited over the CESL by any acceptable process (e.g., CVD, PEALD, thermal ALD, PECVD, or the like). The second ILD layer may also be formed of other suitable insulation materials (e.g., PSG, BSG, BPSG, USG, or the like) deposited by any suitable method (e.g., CVD, PECVD, flowable CVD, or the like). After formation, the second ILD layer may be cured, such as by an ultraviolet curing process.

Figure 18D:
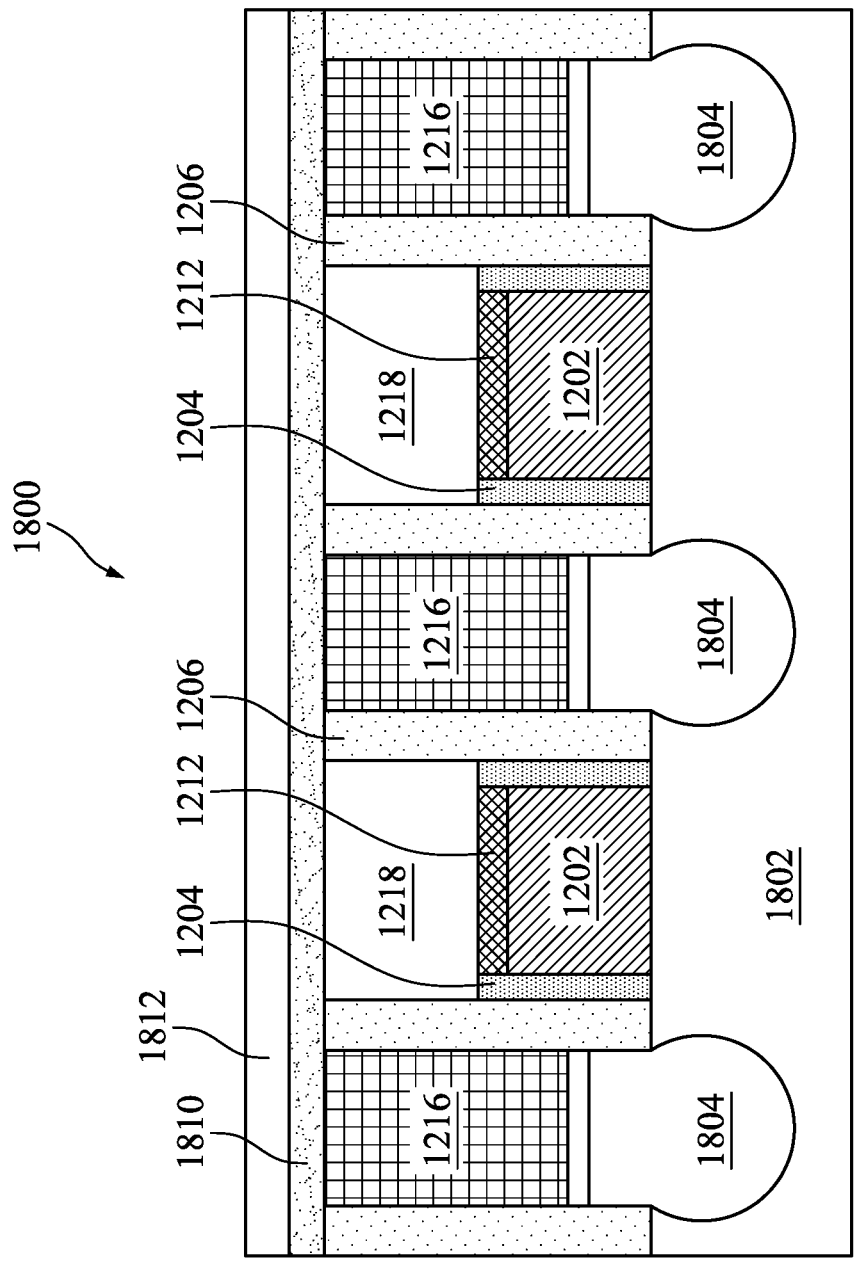

Referring to the example of FIG. 18D, in an embodiment after completion of blocks 1714 and 1716, the area 1800 includes a CESL layer 1810 formed over the source/drain and gate regions and a second ILD layer 1812 formed over the CESL layer 1810.

At block 1718, the example method 1700 includes forming contact via openings in the CESL and the second ILD layer for gate via contacts and for source/drain via contacts. Contact via openings for the gate via contact and the source/drain via contact are formed through using one or more etching processes. According to some embodiments, openings for the gate via contact are formed through the second ILD layer, the CESL, and the first ILD layer and openings for the source/drain via contact are formed through the second ILD layer and the CESL. The openings may be formed using any combination of acceptable photolithography and suitable etching techniques such as dry etching process (e.g., plasma etch, reactive ion etch (RIE), physical etching (e.g., ion beam etch (IBE))), wet etching, combinations thereof, and the like. However, any suitable etching processes may be utilized to form the contact via openings.

At block 1720, the example method 1700 includes forming VIA gate contacts and source/drain via contacts. The gate via contact is formed over and electrically coupled to the W cap and the source/drain via contact is formed over and electrically coupled to source/drain contacts. The VIA gate contacts and/or the source/drain via contacts can be formed by depositing metal material in the opening. The metal material may be deposited by CVD, ALD, electroless deposition (ELD), PVD, electroplating, or another deposition technique. The VIA gate contacts and/or the source/drain via contacts may be or comprise tungsten, cobalt, copper, ruthenium, aluminum, gold, silver, alloys thereof, the like, or a combination thereof.

Figure 18E:
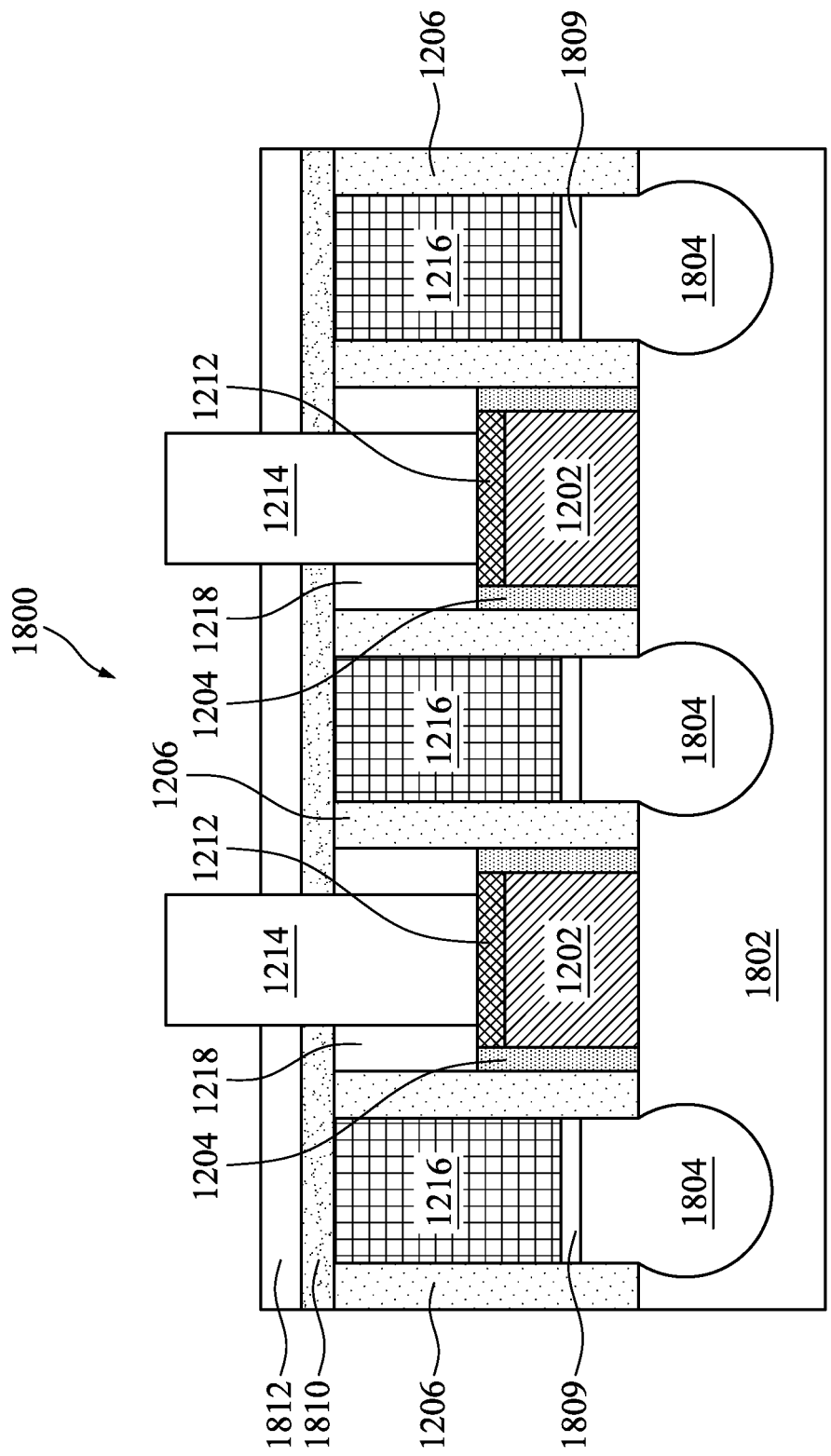

Referring to the example of FIG. 18E, in an embodiment after completion of blocks 1718 and 1720, the area 1800 includes VIA gate contacts 1214 and source/drain via contacts (not shown).

At block 1722, the example method 1700 includes performing further fabrication operations. A semiconductor device may undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1700, and some process steps described above may be replaced or eliminated in accordance with various embodiments of the method 1700.

The described systems, methods, techniques, and articles for an improved Via Gate (VG). The described systems, methods, techniques, and articles can be used with a wide range of semiconductor devices including GAA and FinFET.

A semiconductor device includes a gate structure over a semiconductor substrate and a continuous tungsten (W) cap formed over the gate structure. The gate structure includes a high-k dielectric layer; one or more work function metal layers; a silicon cap (scap) layer including a silicon oxide material; and a glue layer. The continuous tungsten (W) cap is disposed over the gate structure. The W cap includes: a first W material layer disposed over the high-k dielectric layer, the one or more work function metal layers, and the glue layer. The W cap further includes a second W material layer disposed over the first W material layer and a recess in a top surface of the scap layer that is not covered by W material from the first W material layer.

In certain embodiments of the semiconductor device, the continuous tungsten (W) cap was formed by: W material (e.g., a first W material layer) being deposited over the gate structure which formed a discontinuous W cap during first deposition operations with portions of the scap layer not covered by the W material; the discontinuous W cap being etched back to expose the scap layer using first etching operations; a top surface of the scap layer being etched back to form a recess in the top surface during second etching operations; additional W material (e.g., a second W material layer) being deposited over the gate structure to create the continuous W cap during second deposition operations; and unwanted W material being removed during third etching operations.

In certain embodiments of the semiconductor device, the W cap is about 1 nm to about 2 nm thick.

In certain embodiments, the semiconductor device further includes: a first silicide layer between the scap layer and the W cap in a first side of the gate structure; a second silicide layer between the scap layer and the W cap in a second side of the gate structure; a region around the first silicide layer defined by a first angle, a second angle, and a third angle, wherein the first angle is an angle between a horizontal plane of the gate structure and a first edge of the first silicide layer, the second angle is an angle between the horizontal plane of the gate structure and a second edge of the first silicide layer, and the third angle is an angle between the first edge of the first silicide layer and the second edge of the first silicide layer; and a region around the second silicide layer defined by a fourth angle, a fifth angle, and a sixth angle, wherein the fourth angle is an angle between the horizontal plane of the gate structure and a first edge of the second silicide layer, the fifth angle is an angle between the horizontal plane of the gate structure and a second edge of the second silicide layer, and the sixth angle is an angle between the first edge of the second silicide layer and the second edge of the second silicide layer.

In certain embodiments of the semiconductor device, the magnitude of the first angle is substantially equal to the magnitude of the fourth angle, the magnitude of the second angle is substantially equal to the magnitude of the fifth angle, and the magnitude of the third angle is substantially equal to the magnitude of the sixth angle.

In certain embodiments of the semiconductor device, the magnitude of the first angle ranges from about 10° to about 70°, the magnitude of the second angle ranges from about 10° to about 70°, and the magnitude of the third angle is equal to 180° minus the sum of the magnitudes of the first angle and the second angle.

In certain embodiments of the semiconductor device, the W material includes fluorine free tungsten (FFW).

A semiconductor fabrication method includes receiving a gate structure that includes a high-k dielectric layer; one or more work function metal layers; a silicon cap (scap) layer that includes a silicon oxide material; and a glue layer. The semiconductor fabrication method further includes depositing tungsten (W) material over the gate structure during first deposition operations, wherein a discontinuous W cap is formed over the gate structure; etching back the W material over the scap layer during first etching operations; etching a top surface of the scap layer during second etching operations, wherein a recess is formed in the scap layer; depositing additional W material over the gate structure including the recess in the scap layer to form a continuous W cap over the gate structure during second deposition operations; and containing lateral growth of the W cap by removing unwanted W material during third etching operations.

In certain embodiments, the semiconductor fabrication method further includes pretreating the top surface of the gate structure using an oxygen ($O_2$) gas plasma treatment prior to the first deposition operations.

In certain embodiments of the semiconductor fabrication method, pretreating the top surface of the gate structure includes pretreating the top surface of the gate structure at a pressure of about 1000 Torr to about 2500 Torr and at a power of about 1000 W to about 3000 W.

In certain embodiments of the semiconductor fabrication method, wherein etching back the W material over the scap layer during first etching operations includes etching back the W material over the scap layer during first etching operations using an ozone-deionized water ($DIO_3$) solution at a concentration of about 10 ppm to about 100 ppm.

In certain embodiments of the semiconductor fabrication method, etching a top surface of the scap layer during second etching operations includes etching a top surface of the scap layer during second etching operations using a dilute solution of hydrofluoric acid (HF) in deionized water in a volumetric ratio of about 1:100 to about 1:500.

In certain embodiments of the semiconductor fabrication method, removing unwanted W material during third etching operations includes removing unwanted W material during the third etching operations using ozone-deionized water ($DIO_3$).

In certain embodiments of the semiconductor fabrication method, the W material includes fluorine free tungsten (FFW).

A semiconductor fabrication method includes receiving a gate structure that includes a high-k dielectric layer; one or more work function metal layers; a silicon cap (scap) layer including a silicon oxide material; and a glue layer including titanium nitride (TiN). The semiconductor fabrication method further includes pretreating a top layer of the gate structure using oxygen ($O_2$) gas; depositing fluorine free tungsten (FFW) material over the gate structure during first deposition operations, wherein a discontinuous W cap is formed over the gate structure; etching back the FFW material over the scap layer during first etching operations using an ozone solution ($DIO_3$), wherein a top surface of the scap layer is exposed for further processing; etching the top surface of the scap layer during second etching operations using dilute hydrofluoric acid (dHF), wherein a recess is formed in the scap layer; depositing additional FFW material over the gate structure including the recess in the scap layer during second deposition operations, wherein a continuous FFW cap is formed; and containing lateral growth of the continuous FFW cap by removing unwanted FFW material from the surface of gate spacers using an ozone solution (DIO$_3$) during third etching operations.

In certain embodiments of the method, depositing additional FFW material over the gate structure including the recess in the scap layer during second deposition operations includes: forming a first silicide layer between the scap layer and the FFW cap in a first side of the gate structure; forming a second silicide layer between the scap layer and the FFW cap in a second side of the gate structure; forming a region around the first silicide layer defined by a first angle, a second angle, and a third angle, wherein the first angle is an angle between a horizontal plane of the gate structure and a first edge of the first silicide layer, the second angle is an angle between the horizontal plane of the gate structure and a second edge of the first silicide layer, and the third angle is an angle between the first edge of the first silicide layer and the second edge of the first silicide layer; and forming a region around the second silicide layer defined by a fourth angle, a fifth angle, and a sixth angle, wherein the fourth angle is an angle between the horizontal plane of the gate structure and a first edge of the second silicide layer, the fifth angle is an angle between the horizontal plane of the gate structure and a second edge of the second silicide layer, and the sixth angle is an angle between the first edge of the second silicide layer and the second edge of the second silicide layer.

In certain embodiments of the method, the magnitude of the first angle is substantially equal to the magnitude of the fourth angle, the magnitude of the second angle is substantially equal to the magnitude of the fifth angle, and the magnitude of the third angle is substantially equal to the magnitude of the sixth angle.

In certain embodiments of the method, the magnitude of the first angle ranges from about 10° to about 70°, the magnitude of the second angle ranges from about 10° to about 70°, and the magnitude of the third angle is equal to 180° minus the sum of the magnitudes of the first angle and the second angle.

In certain embodiments of the method, the concentration of the DIO$_3$ solution used during the first etching operations and during the third etching operations is about 10 ppm to about 100 ppm.

In certain embodiments of the method, the dHF includes HF and deionized water in a volumetric ratio of about 1:100 to about 1:500.

In certain embodiments of the method, pretreating the top surface of the gate structure using oxygen (O$_2$) gas includes pretreating the top surface of the gate structure using oxygen (O$_2$) gas at a pressure of about 1000 Torr to about 2500 Torr and at a power of about 1000 W to about 3000 W.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    receiving a gate structure comprising:
        a high-k dielectric layer;
        one or more work function metal layers;
        a silicon cap (scap) layer comprising a silicon oxide material; and
        a glue layer;
    depositing tungsten (W) material over the gate structure during first deposition operations, wherein a discontinuous W cap is formed over the gate structure;
    etching back the W material over the scap layer during first etching operations;
    etching a top surface of the scap layer during second etching operations, wherein a recess is formed in the scap layer;
    depositing additional W material over the gate structure including the recess in the scap layer which forms a continuous W cap over the gate structure during second deposition operations; and
    containing lateral growth of the W cap by removing unwanted W material during third etching operations.

2. The method of claim 1, further comprising pretreating the top surface of the gate structure using an oxygen (O$_2$) gas plasma treatment prior to the first deposition operations.

3. The method of claim 2 wherein pretreating the top surface of the gate structure comprises pretreating the top surface of the gate structure at a pressure of about 1000 Torr to about 2500 Torr and at a power of about 1000 W to about 3000 W.

4. The method of claim 1, wherein etching back the W material over the scap layer during first etching operations comprises etching back the W material over the scap layer during first etching operations using an ozone-deionized water (DIO$_3$) solution at a concentration of about 10 ppm to about 100 ppm.

5. The method of claim 1, wherein etching the top surface of the scap layer during second etching operations comprises using a dilute solution of hydrofluoric acid (HF) in deionized water in a volumetric ratio of about 1:100 to about 1:500.

6. The method of claim 1, wherein removing unwanted W material during third etching operations comprises removing unwanted W material during the third etching operations using ozone-deionized water (DIO$_3$).

7. The method of claim 1, wherein the W material comprises fluorine free tungsten (FFW).

8. A method comprising:
    receiving a gate structure comprising:
        a high-k dielectric layer;
        one or more work function metal layers;
        a silicon cap (scap) layer comprising a silicon oxide material; and
        a glue layer comprising titanium nitride (TiN);
    pretreating a top surface of the gate structure using oxygen (O$_2$) gas;
    depositing fluorine free tungsten (FFW) material over the gate structure during first deposition operations, wherein a discontinuous W cap is formed over the gate structure;
    etching back the FFW material over the scap layer during first etching operations using an ozone solution (DIO$_3$), wherein a top surface of the scap layer is exposed for further processing;
    etching the top surface of the scap layer during second etching operations using dilute hydrofluoric acid (dHF), wherein a recess is formed in the scap layer;

depositing additional FFW material over the gate structure including the recess in the scap layer during second deposition operations, wherein a continuous FFW cap is formed; and containing lateral growth of the continuous FFW cap by removing unwanted FFW material from a surface of gate spacers using an ozone solution ($DIO_3$) during third etching operations.

9. The method of claim 8, wherein depositing additional FFW material over the gate structure including the recess in the scap layer during second deposition operations comprises:

forming a first silicide layer between the scap layer and the FFW cap in a first side of the gate structure;

forming a second silicide layer between the scap layer and the FFW cap in a second side of the gate structure;

forming a region around the first silicide layer defined by a first angle, a second angle, and a third angle, wherein the first angle is an angle between a horizontal plane of the gate structure and a first edge of the first silicide layer, the second angle is an angle between the horizontal plane of the gate structure and a second edge of the first silicide layer, and the third angle is an angle between the first edge of the first silicide layer and the second edge of the first silicide layer; and forming a region around the second silicide layer defined by a fourth angle, a fifth angle, and a sixth angle, wherein the fourth angle is an angle between the horizontal plane of the gate structure and a first edge of the second silicide layer, the fifth angle is an angle between the horizontal plane of the gate structure and a second edge of the second silicide layer, and the sixth angle is an angle between the first edge of the second silicide layer and the second edge of the second silicide layer.

10. The method of claim 9, wherein a magnitude of the first angle is substantially equal to a magnitude of the fourth angle, a magnitude of the second angle is substantially equal to a magnitude of the fifth angle, and a magnitude of the third angle is substantially equal to a magnitude of the sixth angle.

11. The method of claim 9, wherein a magnitude of the first angle ranges from about 10° to about 70°, a magnitude of the second angle ranges from about 10° to about 70°, and a magnitude of the third angle is equal to 180° minus a sum of the magnitudes of the first angle and the second angle.

12. The method of claim 8, wherein a concentration of the $DIO_3$ solution used during the first etching operations and during the third etching operations is about 10 ppm to about 100 ppm.

13. The method of claim 8, wherein the dHF comprises HF and deionized water in a volumetric ratio of about 1:100 to about 1:500.

14. The method of claim 8, wherein pretreating the top surface of the gate structure using oxygen ($O_2$) gas comprises pretreating the top surface of the gate structure using oxygen ($O_2$) gas at a pressure of about 1000 Torr to about 2500 Torr and at a power of about 1000 W to about 3000 W.

15. A method comprising:
receiving a gate structure over a semiconductor substrate, the gate structure comprising:
a high-k dielectric layer;
one or more work function metal layers;
a silicon cap (scap) layer comprising a silicon oxide material; and
a glue layer; and
forming a continuous tungsten (W) cap over the gate structure, the continuous W cap comprising:
a first W material layer disposed over the high-k dielectric layer, the one or more work function metal layers, and the glue layer; and
a second W material layer disposed over the first W material layer and a recess in a top surface of the scap layer that is not covered by W material from the first W material layer.

16. The method of claim 15, wherein the continuous W cap has a thickness of about 1 nm to about 2 nm.

17. The method of claim 15, further comprising:
forming a first silicide layer between the scap layer and the continuous W cap in a first side of the gate structure; and
forming a second silicide layer between the scap layer and the continuous W cap in a second side of the gate structure;
wherein a region around the first silicide layer is defined by a first angle, a second angle, and a third angle, wherein the first angle is an angle between a horizontal plane of the gate structure and a first edge of the first silicide layer, the second angle is an angle between the horizontal plane of the gate structure and a second edge of the first silicide layer, and the third angle is an angle between the first edge of the first silicide layer and the second edge of the first silicide layer; and
wherein a region around the second silicide layer is defined by a fourth angle, a fifth angle, and a sixth angle, wherein the fourth angle is an angle between the horizontal plane of the gate structure and a first edge of the second silicide layer, the fifth angle is an angle between the horizontal plane of the gate structure and a second edge of the second silicide layer, and the sixth angle is an angle between the first edge of the second silicide layer and the second edge of the second silicide layer.

18. The method of claim 17, wherein a magnitude of the first angle is substantially equal to a magnitude of the fourth angle, a magnitude of the second angle is substantially equal to the magnitude of the fifth angle, and a magnitude of the third angle is substantially equal to the magnitude of the sixth angle.

19. The method of claim 17, wherein a magnitude of the first angle ranges from about 10° to about 70°, a magnitude of the second angle ranges from about 10° to about 70°, and a magnitude of the third angle is equal to 180° minus a sum of the magnitudes of the first angle and the second angle.

20. The Method of claim 15, wherein the W material comprises fluorine free tungsten (FFW).

* * * * *